United States Patent
Leipold et al.

(10) Patent No.: US 9,859,183 B2
(45) Date of Patent: Jan. 2, 2018

(54) PRINTED CIRCUIT MODULE HAVING A SEMICONDUCTOR DEVICE WITH A PROTECTIVE LAYER IN PLACE OF A LOW-RESISTIVITY HANDLE LAYER

(71) Applicant: RF Micro Devices, Inc., Greensboro, NC (US)

(72) Inventors: Dirk Robert Walter Leipold, San Jose, CA (US); Julio C. Costa, Oak Ridge, NC (US); Baker Scott, San Jose, CA (US); George Maxim, Saratoga, CA (US)

(73) Assignee: Qorvo US, Inc., Greensboro, NC (US)

( * ) Notice: Subject to any disclaimer, the term of this patent is extended or adjusted under 35 U.S.C. 154(b) by 0 days.

(21) Appl. No.: 14/885,202

(22) Filed: Oct. 16, 2015

(65) Prior Publication Data
US 2016/0126196 A1    May 5, 2016

Related U.S. Application Data

(60) Provisional application No. 62/074,429, filed on Nov. 3, 2014.

(51) Int. Cl.
  *H01L 23/29* (2006.01)
  *H01L 23/31* (2006.01)
  (Continued)

(52) U.S. Cl.
  CPC ...... *H01L 23/315* (2013.01); *H01L 21/02266* (2013.01); *H01L 21/02282* (2013.01);
  (Continued)

(58) Field of Classification Search
  CPC ... H01L 23/315; H01L 23/291; H01L 23/293; H01L 23/562; H01L 23/3731; H05K 1/181; H05K 1/0203
  See application file for complete search history.

(56) References Cited

U.S. PATENT DOCUMENTS

| | | |
|---|---|---|
| 4,093,562 A | 6/1978 | Kishimoto |
| 4,366,202 A | 12/1982 | Borovsky |

(Continued)

FOREIGN PATENT DOCUMENTS

| | | |
|---|---|---|
| CN | 103811474 A | 5/2014 |
| JP | 2006005025 A | 1/2006 |

(Continued)

OTHER PUBLICATIONS

MatWeb (Apr. 6, 2016).*

(Continued)

*Primary Examiner* — A. Sefer
(74) *Attorney, Agent, or Firm* — Withrow & Terranova, P.L.L.C.

(57) ABSTRACT

A printed circuit module having a protective layer in place of a low-resistivity handle layer and methods for manufacturing the same are disclosed. The printed circuit module includes a printed circuit substrate with a thinned die attached to the printed circuit substrate. The thinned die includes at least one device layer over the printed circuit substrate and at least one deep well within the at least one device layer. A protective layer is disposed over the at least one deep well, wherein the protective layer has a thermal conductivity greater than 2 watts per meter Kelvin (W/mK) and an electrical resistivity of greater than $10^6$ Ohm-cm.

19 Claims, 14 Drawing Sheets

(51) Int. Cl.
*H01L 21/304* (2006.01)
*H01L 21/02* (2006.01)
*H01L 21/683* (2006.01)
*H01L 23/373* (2006.01)
*H01L 23/00* (2006.01)
*H05K 1/02* (2006.01)
*H05K 1/18* (2006.01)
*H01Q 1/50* (2006.01)
*H01L 23/36* (2006.01)
*H01L 21/56* (2006.01)
*H01L 23/20* (2006.01)
*H01L 23/367* (2006.01)
*H01L 21/306* (2006.01)
*H01L 23/522* (2006.01)
*H01L 49/02* (2006.01)

(52) U.S. Cl.
CPC .......... *H01L 21/304* (2013.01); *H01L 21/565* (2013.01); *H01L 21/6835* (2013.01); *H01L 23/20* (2013.01); *H01L 23/291* (2013.01); *H01L 23/293* (2013.01); *H01L 23/3135* (2013.01); *H01L 23/36* (2013.01); *H01L 23/367* (2013.01); *H01L 23/3731* (2013.01); *H01L 23/3737* (2013.01); *H01L 23/562* (2013.01); *H01Q 1/50* (2013.01); *H05K 1/0203* (2013.01); *H05K 1/181* (2013.01); *H01L 21/30604* (2013.01); *H01L 23/3121* (2013.01); *H01L 23/5223* (2013.01); *H01L 23/5227* (2013.01); *H01L 23/5228* (2013.01); *H01L 24/17* (2013.01); *H01L 28/10* (2013.01); *H01L 28/20* (2013.01); *H01L 28/40* (2013.01); *H01L 2221/6834* (2013.01); *H01L 2221/68327* (2013.01); *H01L 2221/68381* (2013.01); *H01L 2224/16225* (2013.01); *H01L 2924/0002* (2013.01); *H01L 2924/19011* (2013.01); *H01L 2924/19041* (2013.01); *H01L 2924/19042* (2013.01); *H01L 2924/19043* (2013.01)

(56) References Cited

U.S. PATENT DOCUMENTS

| | | |
|---|---|---|
| 5,061,663 A | 10/1991 | Bolt et al. |
| 5,069,626 A | 12/1991 | Patterson et al. |
| 5,391,257 A | 2/1995 | Sullivan et al. |
| 5,459,368 A | 10/1995 | Onishi et al. |
| 5,646,432 A | 7/1997 | Iwaki et al. |
| 5,648,013 A | 7/1997 | Uchida et al. |
| 5,699,027 A | 12/1997 | Tsuji et al. |
| 5,709,960 A | 1/1998 | Mays et al. |
| 5,831,369 A | 11/1998 | Fürbacher et al. |
| 5,920,142 A | 7/1999 | Onishi et al. |
| 6,072,557 A | 6/2000 | Kishimoto |
| 6,154,372 A * | 11/2000 | Kalivas .............. H01L 23/24 257/678 |
| 6,235,554 B1 | 5/2001 | Akram et al. |
| 6,236,061 B1 | 5/2001 | Walpita |
| 6,268,654 B1 * | 7/2001 | Glenn .............. G11C 16/18 257/701 |
| 6,426,559 B1 | 7/2002 | Bryan et al. |
| 6,446,316 B1 | 9/2002 | Fürbacher et al. |
| 6,578,458 B1 | 6/2003 | Akram et al. |
| 6,649,012 B2 | 11/2003 | Masayuki et al. |
| 6,864,156 B1 | 3/2005 | Conn |
| 6,943,429 B1 | 9/2005 | Glenn et al. |
| 6,992,400 B2 | 1/2006 | Tikka et al. |
| 7,042,072 B1 | 5/2006 | Kim et al. |
| 7,049,692 B2 | 5/2006 | Nishimura et al. |
| 7,109,635 B1 | 9/2006 | McClure et al. |
| 7,183,172 B2 | 2/2007 | Lee et al. |
| 7,288,435 B2 | 10/2007 | Aigner et al. |
| 7,307,003 B2 | 12/2007 | Reif et al. |
| 7,393,770 B2 | 7/2008 | Wood et al. |
| 7,427,824 B2 | 9/2008 | Iwamoto et al. |
| 7,596,849 B1 | 10/2009 | Carpenter et al. |
| 7,619,347 B1 | 11/2009 | Bhattacharjee |
| 7,635,636 B2 | 12/2009 | McClure et al. |
| 7,714,535 B2 | 5/2010 | Yamazaki et al. |
| 7,790,543 B2 | 9/2010 | Abadeer et al. |
| 7,855,101 B2 | 12/2010 | Furman et al. |
| 7,868,419 B1 | 1/2011 | Kerr et al. |
| 7,960,218 B2 | 6/2011 | Ma et al. |
| 8,183,151 B2 | 5/2012 | Lake |
| 8,420,447 B2 | 4/2013 | Tay et al. |
| 8,503,186 B2 | 8/2013 | Lin et al. |
| 8,643,148 B2 | 2/2014 | Lin et al. |
| 8,772,853 B2 | 7/2014 | Hong et al. |
| 8,791,532 B2 | 7/2014 | Graf et al. |
| 8,802,495 B2 | 8/2014 | Kim et al. |
| 8,816,407 B2 | 8/2014 | Kim et al. |
| 8,835,978 B2 | 9/2014 | Mauder et al. |
| 8,906,755 B1 | 12/2014 | Hekmatshoartabari et al. |
| 8,921,990 B2 | 12/2014 | Park et al. |
| 8,927,968 B2 | 1/2015 | Cohen et al. |
| 8,963,321 B2 | 2/2015 | Lenniger et al. |
| 9,165,793 B1 | 10/2015 | Wang et al. |
| 9,368,429 B2 | 6/2016 | Ma et al. |
| 9,461,001 B1 | 10/2016 | Tsai et al. |
| 2001/0004131 A1 | 6/2001 | Masayuki et al. |
| 2002/0185675 A1 | 12/2002 | Furukawa |
| 2004/0164367 A1 * | 8/2004 | Park .............. H03H 9/02094 257/415 |
| 2004/0166642 A1 | 8/2004 | Chen et al. |
| 2004/0219765 A1 | 11/2004 | Reif et al. |
| 2005/0037595 A1 | 2/2005 | Nakahata |
| 2005/0079686 A1 | 4/2005 | Aigner et al. |
| 2005/0212419 A1 | 9/2005 | Vazan et al. |
| 2006/0108585 A1 | 5/2006 | Gan et al. |
| 2006/0261446 A1 | 11/2006 | Wood et al. |
| 2007/0020807 A1 | 1/2007 | Geefay et al. |
| 2007/0069393 A1 | 3/2007 | Asahi et al. |
| 2007/0075317 A1 | 4/2007 | Kato et al. |
| 2007/0190747 A1 | 8/2007 | Humpston et al. |
| 2007/0252481 A1 | 11/2007 | Iwamoto et al. |
| 2007/0276092 A1 | 11/2007 | Kanae et al. |
| 2008/0050852 A1 | 2/2008 | Hwang et al. |
| 2008/0164528 A1 | 7/2008 | Cohen et al. |
| 2008/0272497 A1 | 11/2008 | Lake |
| 2008/0315372 A1 | 12/2008 | Kuan et al. |
| 2009/0008714 A1 | 1/2009 | Chae |
| 2009/0010056 A1 | 1/2009 | Kuo et al. |
| 2009/0014856 A1 | 1/2009 | Knickerbocker |
| 2009/0179266 A1 | 7/2009 | Abadeer et al. |
| 2010/0012354 A1 | 1/2010 | Hedin et al. |
| 2010/0045145 A1 | 2/2010 | Tsuda |
| 2010/0081232 A1 | 4/2010 | Furman et al. |
| 2010/0081237 A1 | 4/2010 | Wong et al. |
| 2010/0109122 A1 | 5/2010 | Ding et al. |
| 2010/0173436 A1 | 7/2010 | Ouellet et al. |
| 2010/0200919 A1 | 8/2010 | Kikuchi |
| 2011/0003433 A1 | 1/2011 | Harayama et al. |
| 2011/0026232 A1 | 2/2011 | Lin et al. |
| 2011/0036400 A1 | 2/2011 | Murphy et al. |
| 2011/0068433 A1 | 3/2011 | Kim et al. |
| 2011/0102002 A1 | 5/2011 | Riehl et al. |
| 2011/0171792 A1 | 7/2011 | Chang et al. |
| 2012/0003813 A1 | 1/2012 | Chuang et al. |
| 2012/0068276 A1 | 3/2012 | Lin et al. |
| 2012/0094418 A1 | 4/2012 | Grama et al. |
| 2012/0104495 A1 | 5/2012 | Zhu et al. |
| 2012/0119346 A1 | 5/2012 | Im et al. |
| 2012/0153393 A1 | 6/2012 | Liang et al. |
| 2012/0168863 A1 | 7/2012 | Zhu et al. |
| 2012/0256260 A1 | 10/2012 | Cheng et al. |
| 2012/0292700 A1 | 11/2012 | Khakifirooz et al. |
| 2012/0299105 A1 | 11/2012 | Cai et al. |
| 2013/0001665 A1 | 1/2013 | Zhu et al. |
| 2013/0015429 A1 | 1/2013 | Hong et al. |
| 2013/0099315 A1 | 4/2013 | Zhu et al. |
| 2013/0147009 A1 | 6/2013 | Kim |

(56) References Cited

U.S. PATENT DOCUMENTS

| | | | |
|---|---|---|---|
| 2013/0155681 A1* | 6/2013 | Nall | F21V 29/004 362/249.02 |
| 2013/0196483 A1 | 8/2013 | Dennard et al. | |
| 2013/0200456 A1 | 8/2013 | Zhu et al. | |
| 2013/0299871 A1 | 11/2013 | Mauder et al. | |
| 2014/0134803 A1 | 5/2014 | Kelly et al. | |
| 2014/0168014 A1 | 6/2014 | Chih et al. | |
| 2014/0210314 A1 | 7/2014 | Bhattacharjee et al. | |
| 2014/0252566 A1 | 9/2014 | Kerr et al. | |
| 2014/0252567 A1* | 9/2014 | Carroll | H01L 21/0237 257/635 |
| 2014/0264813 A1 | 9/2014 | Lin et al. | |
| 2014/0264818 A1 | 9/2014 | Lowe, Jr. et al. | |
| 2014/0306324 A1 | 10/2014 | Costa et al. | |
| 2014/0327150 A1 | 11/2014 | Jung et al. | |
| 2014/0346573 A1 | 11/2014 | Adam et al. | |
| 2015/0115416 A1 | 4/2015 | Costa et al. | |
| 2015/0130045 A1 | 5/2015 | Tseng et al. | |
| 2015/0235990 A1 | 8/2015 | Cheng et al. | |
| 2015/0235993 A1 | 8/2015 | Cheng et al. | |
| 2015/0243881 A1 | 8/2015 | Sankman et al. | |
| 2015/0255368 A1 | 9/2015 | Costa | |
| 2015/0279789 A1 | 10/2015 | Mahajan et al. | |
| 2015/0311132 A1 | 10/2015 | Kuo et al. | |
| 2015/0364344 A1 | 12/2015 | Yu et al. | |
| 2016/0002510 A1 | 1/2016 | Champagne et al. | |
| 2016/0079137 A1* | 3/2016 | Leipold | H01L 23/3135 257/790 |
| 2016/0155706 A1 | 6/2016 | Yoneyama et al. | |
| 2016/0284568 A1 | 9/2016 | Morris et al. | |

FOREIGN PATENT DOCUMENTS

| | | | |
|---|---|---|---|
| JP | 2007227439 A | 9/2007 | |
| JP | 2008235490 A | 10/2008 | |
| JP | 2008279567 A | 11/2008 | |
| JP | 2009026880 A | 2/2009 | |
| JP | 2009530823 A | 8/2009 | |
| WO | 2007074651 A1 | 7/2007 | |

OTHER PUBLICATIONS

PolyOne (Apr. 6, 2016).*
Micak, R. et al., "Photo-Assisted Electrochemical Machining of Micromechanical Structures," Proceedings of Micro Electro Mechanical Systems, Feb. 7-10, 1993, Fort Lauderdale, FL, IEEE, pp. 225-229.
Notice of Allowance for U.S. Appl. No. 14/885,243, mailed Aug. 31, 2016, 8 pages.
Notice of Allowance for U.S. Appl. No. 14/715,830, dated Feb. 10, 2017, 8 pages.
Notice of Allowance for U.S. Appl. No. 14/715,830, dated Mar. 2, 2017, 8 pages.
Non-Final Office Action for U.S. Appl. No. 15/085,185, dated Feb. 15, 2017, 10 pages.
Applicant-Initiated Interview Summary for U.S. Appl. No. 13/852,648, dated Jan. 27, 2014, 4 pages.
Advisory Action for U.S. Appl. No. 13/852,648, dated Mar. 7, 2014, 4 pages.
Notice of Allowance for U.S. Appl. No. 13/852,648, dated Jun. 16, 2014, 9 pages.
Notice of Allowance for U.S. Appl. No. 13/852,648, dated Sep. 26, 2014, 8 pages.
Notice of Allowance for U.S. Appl. No. 13/852,648, dated Jan. 22, 2015, 8 pages.
Non-Final Office Action for U.S. Appl. No. 13/852,648, dated Jun. 24, 2015, 20 pages.
Final Office Action for U.S. Appl. No. 13/852,648, dated Oct. 22, 2015, 20 pages.
Non-Final Office Action for U.S. Appl. No. 13/852,648, dated Feb. 19, 2016, 12 pages.
Non-Final Office Action for U.S. Appl. No. 141315,765, dated Jan. 2, 2015, 6 pages.
Final Office Action for U.S. Appl. No. 14/315,765, dated May 11, 2015, 17 pages.
Advisory Action for U.S. Appl. No. 14/315,765, dated Jul. 22, 2015, 3 pages.
Non-Final Office Action for U.S. Appl. No. 14/260,909, dated Mar. 20, 2015, 20 pages.
Final Office Action for U.S. Appl. No. 14/260,909, dated Aug. 12, 2015, 18 pages.
Non-Final Office Action for U.S. Appl. No. 14/261,029, dated Dec. 5, 2014, 15 pages.
Notice of Allowance for U.S. Appl. No. 14/261,029, dated Apr. 27, 2015, 10 pages.
Corrected Notice of Allowability for U.S. Appl. No. 14/261,029, dated Nov. 17, 2015, 5 pages.
Non-Final Office Action for U.S. Appl. No. 141529,870, dated Feb. 12, 2016, 14 pages.
Non-Final Office Action for U.S. Appl. No. 14/715,830, dated Apr. 13, 2016, 16 pages.
Extended European Search Report for European Patent Application No. 15184861.1, dated Jan. 25, 2016, 6 pages.
Non-Final Office Action for U.S. Appl. No. 12/906,689, dated May 27, 2011, 13 pages.
Non-Final Office Action for U.S. Appl. No. 12/906,689, dated Nov. 4, 2011, 20 pages.
Search Report for Japanese Patent Application No. 2011-229152, created on Feb. 22, 2013, 58 pages.
Office Action for Japanese Patent Application No. 2011-229152, drafted May 10, 2013, 7 pages.
Final Rejection for Japanese Patent Application No. 2011-229152, drafted Oct. 25, 2013, 2 pages.
Final Office Action for U.S. Appl. No. 13/852,648, dated Jul. 20, 2016, 14 pages.
Notice of Allowance for U.S. Appl. No. 14/529,870, dated Jul. 15, 2016, 8 pages.
Office Action of the Intellectual Property Office for Taiwanese Patent Application No. 104130224, dated Jun. 15, 2016, 9 pages.
Author Unknown, "Fully Sintered Ferrite Powders," Powder Processing and Technology, LLC, Date Unknown, 1 page.
Author Unknown, "Hysol UF3808," Henkel Corporation, Technical Data Sheet, May 2013, 2 pages.
Final Office Action for U.S. Appl. No. 14/715,830, dated Sep. 6, 2016, 13 pages.
Advisory Action for U.S. Appl. No. 14/715,830, dated Oct. 31, 2016, 6 pages.
Non-Final Office Action for U.S. Appl. No. 14/851,652, dated Oct. 7, 2016, 10 pages.
Notice of Allowance for U.S. Appl. No. 14/959,129, dated Oct. 11, 2016, 8 pages.
International Search Report and Written Opinion for PCT/US2016/045809, dated Oct. 7, 2016, 11 pages.
Non-Final Office Action for U.S. Appl. No. 15/173,037, dated Jan. 10, 2017, 8 pages.
Notice of Allowance for U.S. Appl. No. 14/885,243, dated Aug. 31, 2016, 8 pages.
Non-Final Office Action for U.S. Appl. No. 15/293,947, dated Apr. 7, 2017, 12 pages.
Notice of Allowance for U.S. Appl. No. 14/851,652, dated Apr. 11, 2017, 9 pages.
Final Office Action for U.S. Appl. No. 15/173,037, dated May 2, 2017, 13 pages.
Non-Final Office Action for U.S. Appl. No. 15/353,346, dated May 23, 2017, 15 pages.
Non-Final Office Action for U.S. Appl. No. 15/085,185, dated Jun. 6, 2017, 5 pages.
Ali, K. Ben et al., "RF SOI CMOS Technology on Commercial Trap-Rich High Resistivity SOI Wafer," 2012 IEEE International SOI Conference (SOI), Oct. 1-4, 2012, Napa, California, IEEE, 2 pages.
Anderson, D.R., "Thermal Conductivity of Polymers," Sandia Corporation, Mar. 8, 1966, pp. 677-690.

(56) References Cited

OTHER PUBLICATIONS

Author Unknown, "CoolPoly D5108 Thermally Conductive Polyphenylene Sulfide (PPS)," Cool Polymers, Inc., Aug. 8, 2007, 2 pages.
Author Unknown, "CoolPoly D5506 Thermally Conductive Liquid Crystalline Polymer (LCP)," Cool Polymers, Inc., Dec. 12, 2013, 2 pages.
Author Unknown, "CoolPoly D-Series—Thermally Conductive Dielectric Plastics," Cool Polymers, Retrieved Jun. 24, 2013, http://coolpolymers.com/dseries.asp, 1 page.
Author Unknown, "CoolPoly E2 Thermally Conductive Liquid Crystalline Polymer (LCP)," Cool Polymers, Inc., Aug. 8, 2007, http://www.coolpolymers.com/Files/DS/Datasheet_e2.pdf, 1 page.
Author Unknown, "CoolPoly E3605 Thermally Conductive Polyamide 4,6 (PA 4,6)," Cool Polymers, Inc., Aug. 1, 2007, 1 page, http://www.coolpolymers.com/Files/DS/Datasheet_e3605.pdf.
Author Unknown, "CoolPoly E5101 Thermally Conductive Polyphenylene Sulfide (PPS)," Cool Polymers, Inc., Aug. 27, 2007, 1 page, http://www.coolpolymers.com/Files/DS/Datasheet_e5101.pdf.
Author Unknown, "CoolPoly E5107 Thermally Conductive Polyphenylene Sulfide (PPS)," Cool Polymers, Inc., Aug. 8, 2007, 1 page, http://coolpolymers.com/Files/DS/Datasheet_e5107.pdf.
Author Unknown, "CoolPoly Selection Tool," Cool Polymers, Inc., 2006, 1 page, http://www.coolpolymers.com/select.asp?Application=Substrates+%26+Electcronic_Packaging.
Author Unknown, "CoolPoly Thermally Conductive Plastics for Dielectric Heat Plates," Cool Polymers, Inc., 2006, 2 pages, http://www.coolpolymers.com/heatplate.asp.
Author Unknown, "CoolPoly Thermally Conductive Plastics for Substrates and Electronic Packaging," Cool Polymers, Inc., 2005, 1 page.
Author Unknown, "Electrical Properties of Plastic Materials," Professional Plastics, Oct. 28, 2011, http://www.professionalplastics.com/professionalplastics/ElectricalPropertiesofPlastics.pdf, accessed Dec. 18, 2014, 4 pages.
Author Unknown, "Heat Transfer," Cool Polymers, Inc., 2006, http://www.coolpolymers.com/heattrans.html, 2 pages.
Author Unknown, "Plastics that Conduct Heat," Plastics Technology Online, Jun. 2001, Retrieved Jun. 24, 2013, http://www.ptonline.com/articles/plastics-that-conduct-heat, 4 pages.
Author Unknown, "Sapphire Substrate," from CRC Handbook of Chemistry and Physics, Date Unknown, 1 page.
Author Unknown, "Thermal Properties of Plastic Materials," Professional Plastics, Aug. 21, 2010, http://www.professionalplastics.com/professionalplastics/ThermalPropertiesofPlasticMaterials.pdf, accessed Dec. 18, 2014, 4 pages.
Author Unknown, "Thermal Properties of Solids," PowerPoint Presentation, No Date, 28 slides, http://www.phys.huji.ac.il/Phys_Hug/Lectures/77602/PHONONS_2_thermal.pdf.
Author Unknown, "Thermal Resistance & Thermal Conductance," C-Therm Technologies Ltd., accessed Sep. 19, 2013, 4 pages, http://www.ctherm.com/products/tci_thermal_conductivity/helpful_links_tools/thermal_resistance_thermal_conductance/.
Beck, D., et al., "CMOS on FZ-High Resistivity Substrate for Monolithic Integration of SiGe-RF-Circuitry and Readout Electronics," IEEE Transactions on Electron Devices, vol. 44, No. 7, Jul. 1997, pp. 1091-1101.
Botula, A., et al., "A Thin-Film SOI 180nm CMOS RF Switch Technology," IEEE Topical Meeting on Silicon Monolithic Integrated Circuits in RF Systems, (SiRF '09), Jan. 2009, pp. 1-4.
Carroll, M., et al., "High-Resistivity SOI CMOS Cellular Antenna Switches," Annual IEEE Compound Semiconductor Integrated Circuit Symposium, (CISC 2009), Oct. 2009, pp. 1-4.
Colinge, J.P., et al., "A Low-Voltage, Low-Power Microwave SOI MOSFET," Proceedings of 1996 IEEE International SOI Conference, Oct. 1996, pp. 128-129.

Costa, J. et al., "Silicon RFCMOS SOI Technology with Above-IC MEMS Integration for Front End Wireless Applications," Bipolar/BiCMOS Circuits and Technology Meeting, 2008, BCTM 2008, IEEE, pp. 204-207.
Costa, J., "RFCMOS SOI Technology for 4G Reconfigurable RF Solutions," Session WEC1-2, Proceedings of the 2013 IEEE International Microwave Symposium, 4 pages.
Esfeh, Babak Kazemi et al., "RF Non-Linearities from Si-Based Substrates," 2014 International Workshop on Integrated Nonlinear Microwave and Millimetre-wave Circuits (INMMiC), Apr. 2-4, 2014, IEEE, 3 pages.
Finne, R.M. et al., "A Water-Amine-Complexing Agent System for Etching Silicon," Journal of the Electrochemical Society, vol. 114, No. 9, Sep. 1967, pp. 965-970.
Gamble, H.S. et al., "Low-Loss CPW Lines on Surface Stabilized High-Resistivity Silicon," IEEE Microwave and Guided Wave Letters, vol. 9, No. 10, Oct. 1999, pp. 395-397.
Huang, Xingyi, et al., "A Review of Dielectric Polymer Composites with High Thermal Conductivity," IEEE Electrical Insulation Magazine, vol. 27, No. 4, Jul./Aug. 2011, pp. 8-16.
Joshi, V. et al., "MEMS Solutions in RF Applications," 2013 IEEE SOI-3D-Subthreshold Microelectronics Technology Unified Conference (S3S), Oct. 2013, IEEE, 2 pages.
Jung, Boo Yang, et al., "Study of FCMBGA with Low CTE Core Substrate," 2009 Electronic Components and Technology Conference, May 2009, pp. 301-304.
Kerr, D.C., et al., "Identification of RF Harmonic Distortion on Si Substrates and Its Reduction Using a Trap-Rich Layer," IEEE Topical Meeting on Silicon Monolithic Integrated Circuits in RF Systems, (SiRF 2008), Jan. 2008, pp. 151-154.
Lederer, D., et al., "New Substrate Passivation Method Dedicated to HR SOI Wafer Fabrication with Increased Substrate Resistivity," IEEE Electron Device Letters, vol. 26, No. 11, Nov. 2005, pp. 805-807.
Lederer, Dimitri et al., "Substrate loss mechanisms for microstrip and CPW transmission lines on lossy silicon wafers," Solid-State Electronics, vol. 47, No. 11, Nov. 2003, pp. 1927-1936.
Lee, Kwang Hong et al., "Integration of III—V materials and Si-CMOS through double layer transfer process," Japanese Journal of Applied Physics, vol. 54, Jan. 2015, pp. 030209-1 to 030209-5.
Lee, Tzung-Yin, et al., "Modeling of SOI FET for RF Switch Applications," IEEE Radio Frequency Integrated Circuits Symposium, May 23-25, 2010, Anaheim, CA, IEEE, pp. 479-482.
Lu, J.Q., et al., "Evaluation Procedures for Wafer Bonding and Thinning of Interconnect Test Structures for 3D ICs," Proceedings of the IEEE 2003 International Interconnect Technology Conference, Jun. 2-4, 2003, pp. 74-76.
Mamunya, Ye.P., et al., "Electrical and Thermal Conductivity of Polymers Filled with Metal Powders," European Polymer Journal, vol. 38, 2002, pp. 1887-1897.
Mansour, Raafat R., "RF MEMES-CMOS Device Integration," IEEE Microwave Magazine, vol. 14, No. 1, Jan. 2013, pp. 39-56.
Mazuré, C. et al., "Advanced SOI Substrate Manufacturing," 2004 IEEE International Conference on Integrated Circuit Design and Technology, 2004, IEEE, pp. 105-111.
Morris, Art, "Monolithic Integration of RF-MEMS within CMOS," 2015 International Symposium on VLSI Technology, Systems and Application (VLSI-TSA), Apr. 27-29, 2015, IEEE, 2 pages.
Niklaus, F., et al., "Adhesive Wafer Bonding," Journal of Applied Physics, vol. 99, No. 3, 031101 (2006), 28 pages.
Parthasarathy, S., et al., "RF SOI Switch FET Design and Modeling Tradeoffs for GSM Applications," 2010 23rd International Conference on VLSI Design, (VLSID '10), Jan. 2010, pp. 194-199.
Raskin, Jean-Pierre et al., "Substrate Crosstalk Reduction Using SOI Technology," IEEE Transactions on Electron Devices, vol. 44, No. 12, Dec. 1997, pp. 2252-2261.
Raskin, J.P., et al., "Coupling Effects in High-Resistivity SIMOX Substrates for VHF and Microwave Applications," Proceedings of 1995 IEEE International SOI Conference, Oct. 1995, pp. 62-63.
Rong, B., et al., "Surface-Passivated High-Resistivity Silicon Substrates for RFICs," IEEE Electron Device Letters, vol. 25, No. 4, Apr. 2004, pp. 176-178.

(56) References Cited

OTHER PUBLICATIONS

Tombak, A., et al., "High-Efficiency Cellular Power Amplifiers Based on a Modified LDMOS Process on Bulk Silicon and Silicon-On-Insulator Substrates with Integrated Power Management Circuitry," IEEE Transactions on Microwave Theory and Techniques, vol. 60, No. 6, Jun. 2012, pp. 1862-1869.
Yamanaka, A., et al., "Thermal Conductivity of High-Strength Polyetheylene Fiber and Applications for Cryogenic Use," International Scholarly Research Network, ISRN Materials Science, vol. 2011, Article ID 718761, May 25, 2011, 10 pages.
Non-Final Office Action for U.S. Appl. No. 13/852,648, dated Jul. 18, 2013, 20 pages.
Final Office Action for U.S. Appl. No. 13/852,648, dated Nov. 26, 2013, 21 pages.
Notice of Allowance for U.S. Appl. No. 15/293,947, dated Aug. 14, 2017, 7 pages.
corrected Notice of Allowance for U.S. Appl. No. 14/851,652, dated Jul. 24, 2017, 6 pages.
Advisory Action for U.S. Appl. No. 15/173,037, dated Jul. 20, 2017, 3 pages.
Notice of Allowance for U.S. Appl. No. 15/173,037, dated Aug. 9, 2017, 7 pages.
Non-Final Office Action for U.S. Appl. No. 15/229,780, dated Jun. 30, 2017, 12 pages.
Non-Final Office Action for U.S. Appl. No. 15/262,457, dated Aug. 7, 2017, 10 pages.
Notice of Allowance for U.S. Appl. No. 15/287,273, dated Jun. 30, 2017, 8 pages.
Corrected Notice of Allowability for U.S. Appl. No. 15/287,273, dated Jul. 21, 2017, 5 pages.
Corrected Notice of Allowance for U.S. Appl. No. 14/851,652, dated Sep. 6, 2017, 5 pages.
Notice of Allowance for U.S. Appl. No. 15/229,780, dated Oct. 3, 2017, 7 pages.
Notice of Allowance for U.S. Appl. No. 15/408,560, dated Sep. 25, 2017, 8 pages.
Notice of Allowance for U.S. Appl. No. 15/287,202, dated Aug. 25, 2017, 11 pages.
Notice of Allowance for U.S. Appl. No. 15/353,346, dated Sep. 25, 2017, 9 pages.
Supplemental Notice of Allowability for U.S. Appl. No. 15/287,273, ated Sep. 7, 2017, 5 pages.
Non-Final Office Action for U.S. Appl. No. 15/652,867, dated Oct. 10, 2017, 5 pages.
Bernheim et al., "Chapter 9: Lamination," Tools and Manufacturing Engineers Handbook (book), Apr. 1, 1996, Society of Manufacturing Engineers, p. 9-1.
Henawy, Mahmoud Al et al., "New Thermoplastic Polymer Substrate for Microstrip Antennas at 60 GHz," German Microwave Conference, Mar. 15-17, 2010, Berlin, Germany, IEEE, pp. 5-8.
Non-Final Office Action for U.S. Appl. No. 15/616,109, dated Oct. 23, 2017, 16 pages.
Corrected Notice of Allowability for U.S. Appl. No. 14/851,652, dated Oct. 20, 2017, 5 pages.
Supplemental Notice of Allowability and Applicant-Initiated Interview Summary for U.S. Appl. No. 15/287,273, dated Oct. 18, 2017, 6 pages.
Supplemental Notice of Allowability for U.S. Appl. No. 15/287,273, dated Nov. 2, 2017, 5 pages.
Notice of Allowance for U.S. Appl. No. 14/872,910, dated Nov. 17, 2017, 11 pages.
Non-Final Office Action for U.S. Appl. No. 15/652,826, dated Nov. 3, 2017, 5 pages.

\* cited by examiner

Cool Polymers®

CoolPoly® D5506 THERMALLY CONDUCTIVE LIQUID CRYSTALLINE POLYMER (LCP)

CoolPoly D series of thermally conductive plastics transfers heat, a characteristic previously unavailable in injection molding grade polymers. CoolPoly is lightweight, netshape moldable and allows design freedom in applications previously restricted to metals. The D series is electrically non-conductive and can be used for its dielectric properties.

| THERMAL | SI/METRIC |
|---|---|
| THERMAL CONDUCTIVITY | 10 W/mK |
| THERMAL DIFFUSIVITY | 0.05 $cm^2$/sec |
| SPECIFIC HEAT | 1.0 J/g°C |
| COEFFICIENT OF LINEAR THERMAL EXPANSION | |
|     PARALLEL | 6.2 ppm/°C |
|     NORMAL | 5.6 ppm/°C |
| TEMPERATURE OF DEFLECTION | |
|     @ 0.45 MPa | >300 °C |
|     @ 1.80 MPa | 263 °C |
| FLAMMABILITY | V0 @ 1.0 mm |
| MECHANICAL | SI/METRIC |
| TENSILE MODULUS | 10900 MPa |
| TENSILE STRENGTH | 50 MPa |
| NOMINAL STRAIN @ BREAK | 0.7 % |
| FLEXURAL STRENGTH | 84 MPa |
| FLEXURAL MODULUS | 12300 MPa |
| IMPACT STRENGTH | |
|     CHARPY UNNOTCHED | 6.0 kJ/$m^2$ |
|     CHARPY NOTCHED | 3.2 kJ/$m^2$ |
| ELECTRICAL | SI/METRIC |
| SURFACE RESISTIVITY | 2.0E14 OHM/SQUARE |
| VOLUME RESISTIVITY | 1.6E14 OHM-CM |
| PHYSICAL | SI/METRIC |
| DENSITY | 1.80 g/cc |
| MOLD SHRINKAGE | |
|     FLOW | 0.1 % |
|     CROSS-FLOW | 0.3 % |

*FIG. 7*

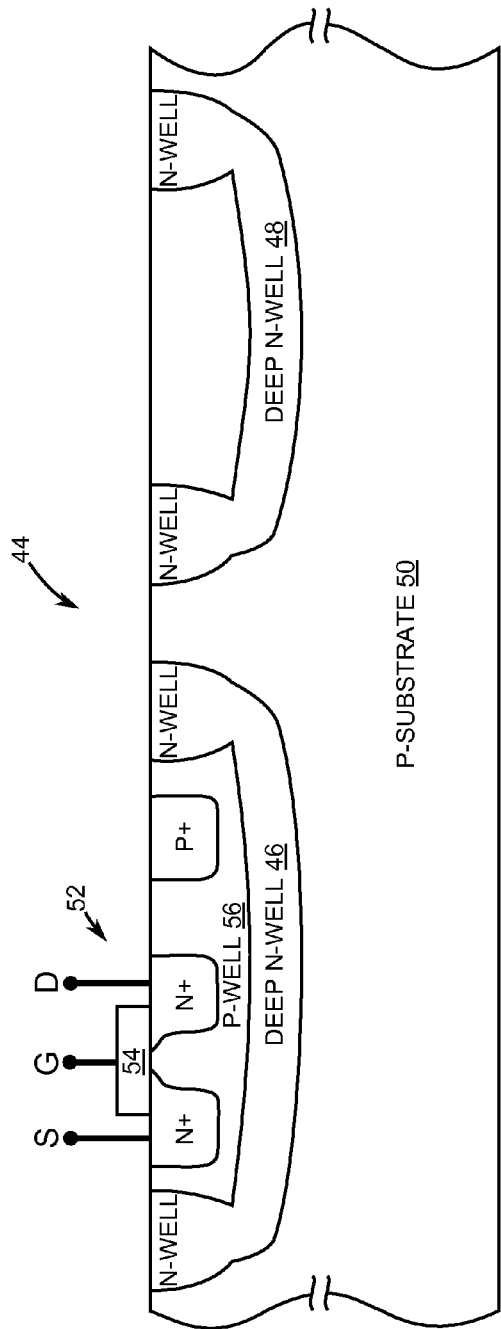
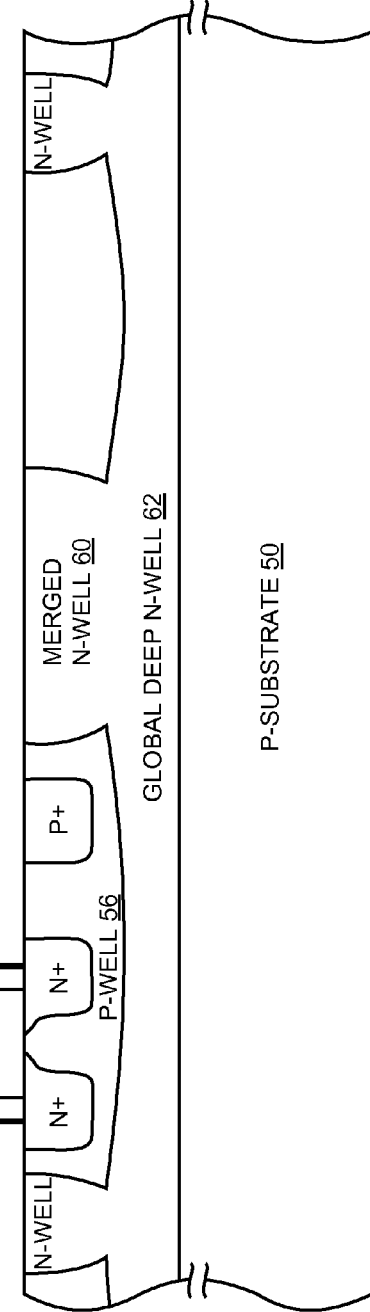
FIGURE 8A (RELATED ART)
FIGURE 8B (RELATED ART)

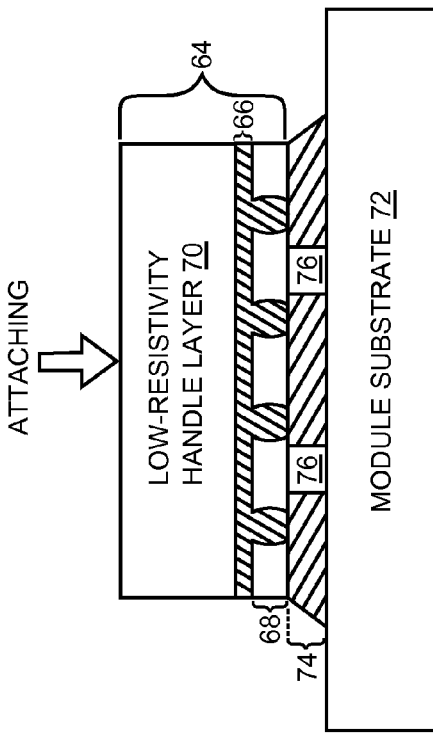
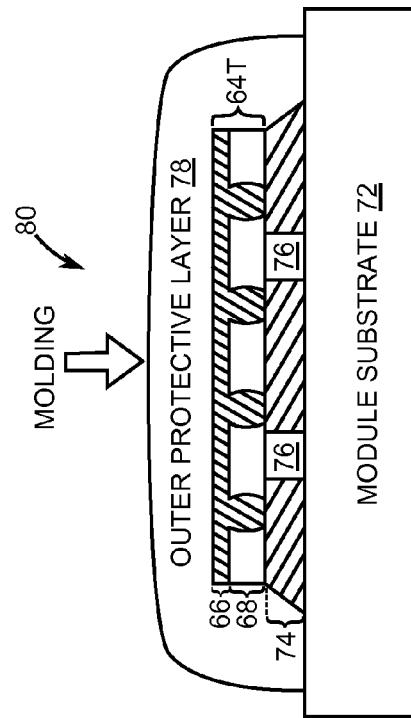
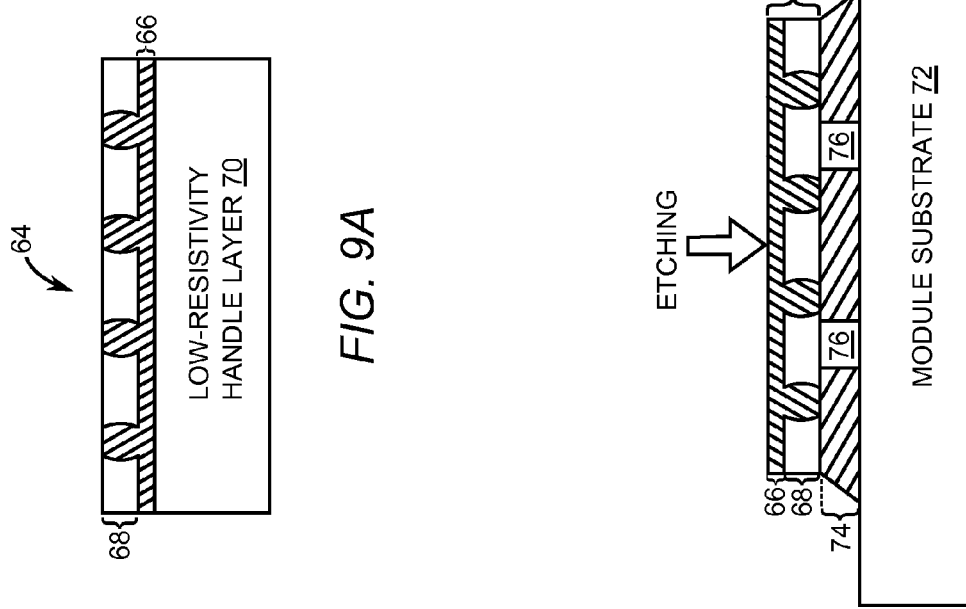

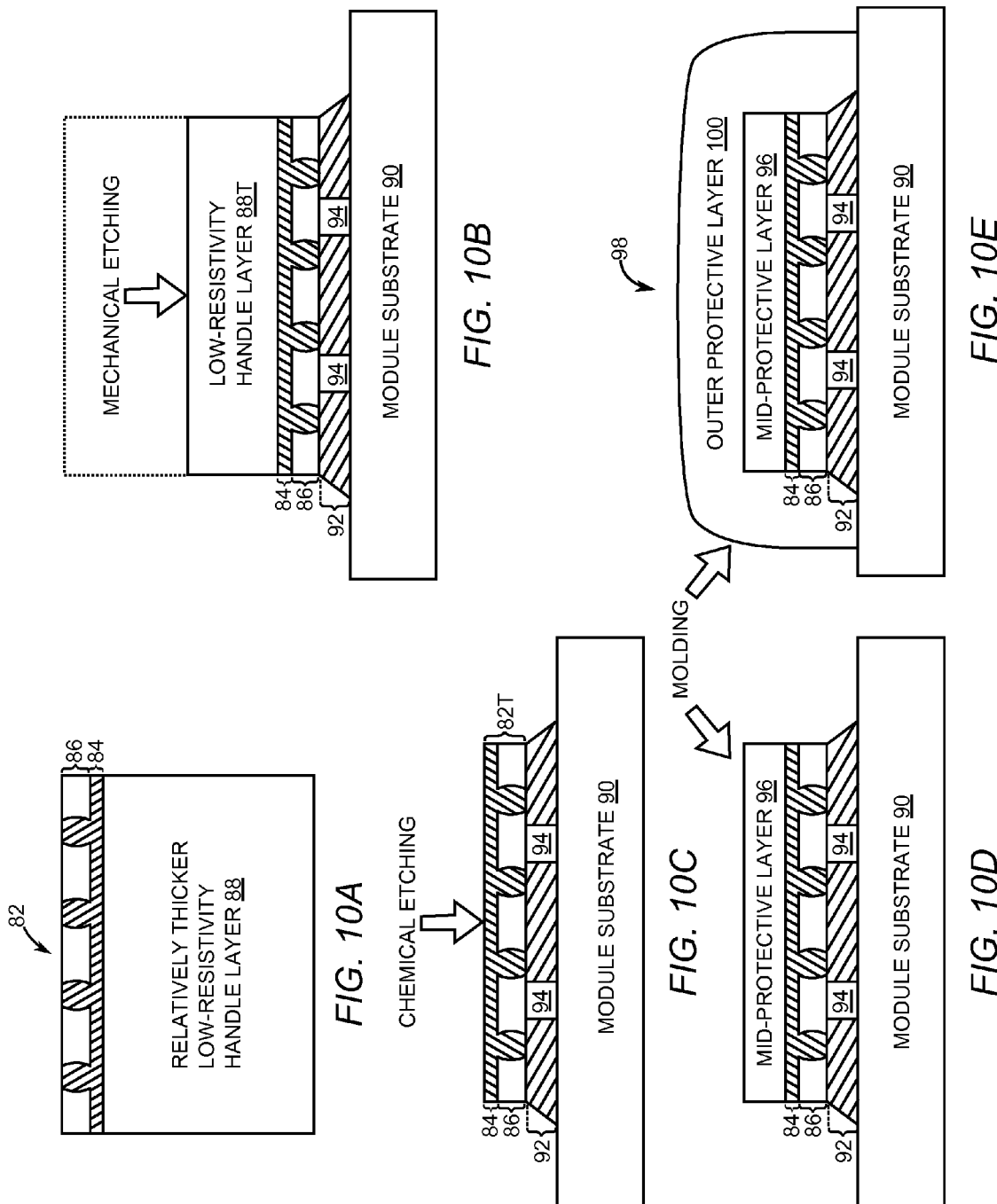

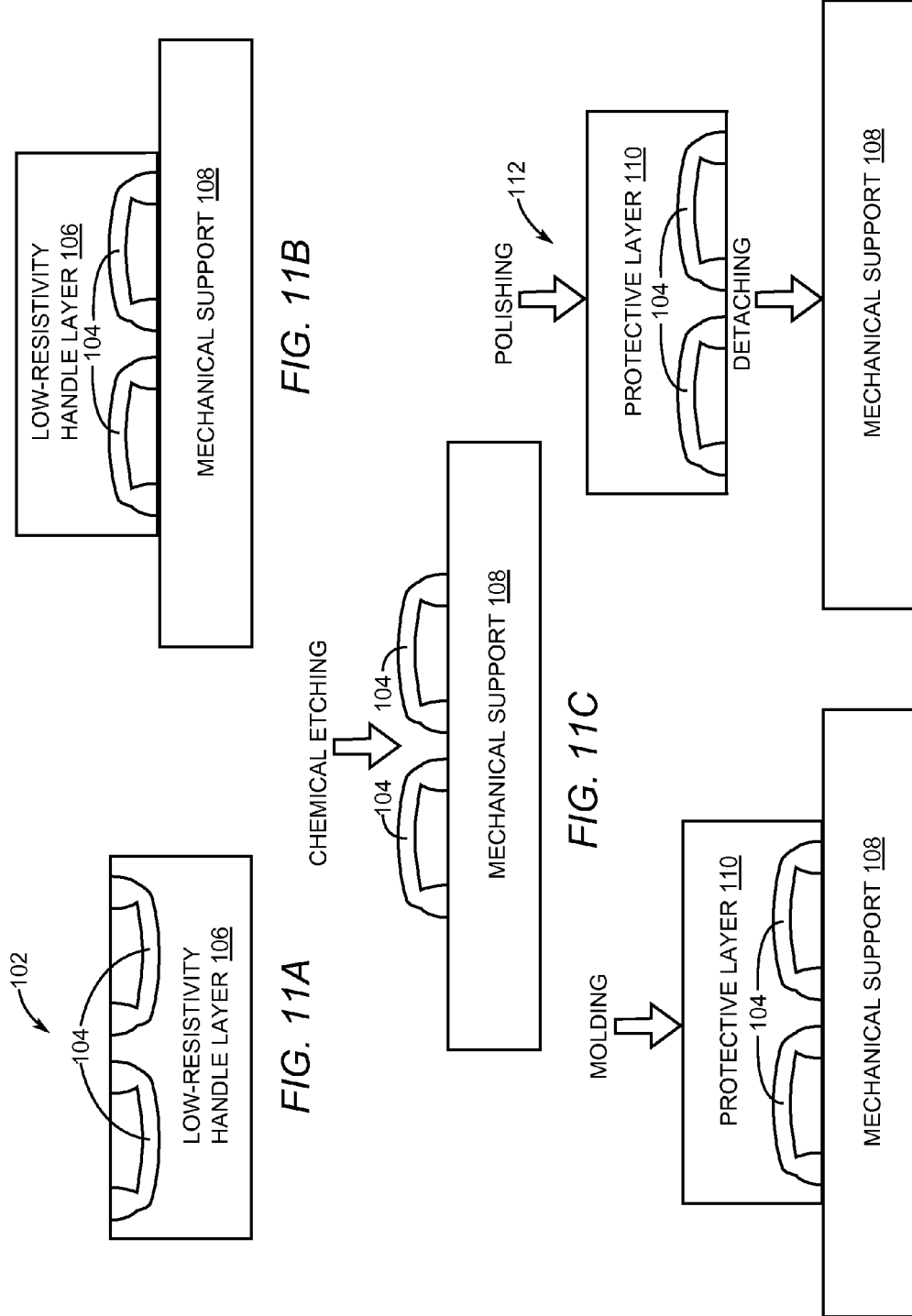

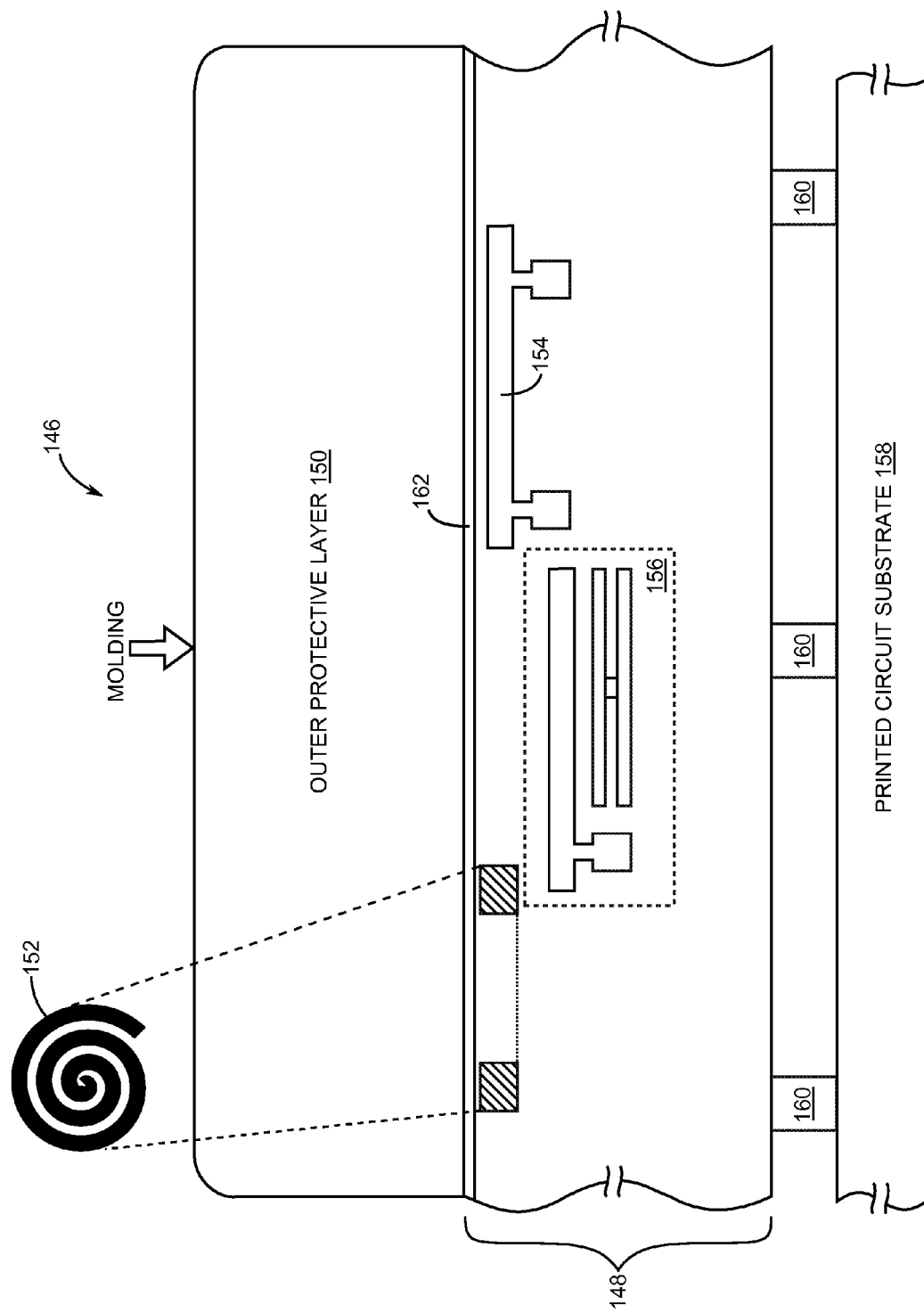

ically, al. $10^6$ Ohm-cm over the at least one deep well.

PRINTED CIRCUIT MODULE HAVING A SEMICONDUCTOR DEVICE WITH A PROTECTIVE LAYER IN PLACE OF A LOW-RESISTIVITY HANDLE LAYER

RELATED APPLICATIONS

This application claims the benefit of U.S. provisional patent application No. 62/074,429, filed Nov. 3, 2014, the disclosure of which is incorporated herein by reference in its entirety.

FIELD OF THE DISCLOSURE

This disclosure relates to semiconductor devices and methods for manufacturing the same.

BACKGROUND

Radio frequency complementary metal oxide (RFCMOS) silicon on insulator (SOI) RF power switches are devices that are essential for practically every mobile handset currently on the market. Existing RFCMOS SOI technologies used to manufacture these devices provide excellent performance in increasingly complex multi-throw RF switches, tunable RF capacitance arrays, and antenna RF tuners. Conventional RFCMOS SOI technologies are built on high resistivity CMOS substrates that have resistivities ranging from 1000 Ohm-cm to 5000 Ohm-cm. A power switch employing RFCMOS SOI technology uses a high resistivity substrate so that a plurality of relatively low voltage field effect transistors (FETs) can be stacked while maintaining a desired isolation between the low voltage FETs.

In an RF switch application for third generation (3G) and fourth generation (4G) wireless applications, a high degree of RF device linearity and a relatively very low level of RF intermodulation under RF power conditions are crucial. Therefore, inherent nonlinearities in RF devices such as CMOS n-type field effect transistor (NFET) devices must be mitigated. Another source of nonlinearities is attributed to a high resistivity silicon handle wafer region interfaced with a buried oxide (BOX) dielectric region. One proposed solution for mitigating these nonlinearities includes a trap rich silicon/oxide interface that degrades carrier lifetimes in the silicon/oxide interface. Other proposed solutions for mitigating the nonlinearities due to the high resistivity handle region interfaced with the BOX dielectric region include harmonic suppression process techniques that include a series of process steps and heating treatments to minimize nonlinearities attributed to the high resistivity handle region interfaced with the BOX dielectric region. However, all the aforementioned proposed solutions add significant complexity and cost to CMOS SOI technology. What is needed are CMOS SOI based semiconductor devices and methods for manufacturing CMOS SOI devices that do not produce the nonlinearities attributed to the high resistivity silicon handle region interfaced with the BOX dielectric region.

SUMMARY

A printed circuit module having a protective layer in place of a low-resistivity handle layer and methods for manufacturing the same are disclosed. The printed circuit module includes a printed circuit substrate with a thinned die attached to the printed circuit substrate. The thinned die includes at least one device layer over the printed circuit substrate and at least one deep well within the at least one device layer. An outer protective layer is disposed over the at least one deep well, wherein the outer protective layer has a thermal conductivity greater than 2 watts per meter Kelvin (W/mK) and an electrical resistivity of greater than $10^3$ Ohm-cm.

An exemplary method includes providing a printed circuit substrate having a die attached to a top side of the printed circuit substrate, the die having at least one device layer over the printed circuit substrate, at least one deep well residing within the at least one device layer and a low-resistivity handle layer over the at least one deep well. Another next step involves removing the low-resistivity handle layer to realize a thinned die and expose the at least one deep well. A following step includes disposing an outer protective layer having a thermal conductivity greater than 2 Watts per meter Kelvin (W/mK) and an electrical resistivity of greater than $10^6$ Ohm-cm over the at least one deep well.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

FIG. 7 is a specification table that lists thermal, mechanical, electrical, and physical specifications for an exemplary polymer material that is usable to form the polymer substrate of the semiconductor device of the present disclosure.

FIG. 8A is a cross-sectional diagram of a related art bulk complementary metal oxide semiconductor (bulk-CMOS) die having separate deep-N-wells.

FIG. 8B is a cross-sectional diagram of a related art bulk-CMOS die having merged N-wells integrated with a global deep N-well.

FIG. 9A is a cross-sectional diagram of a bulk-CMOS die having a global deep N-well and active layer supported by a low-resistivity handle layer in accordance with the present disclosure.

FIG. 9B is a cross-sectional diagram of the bulk-CMOS die of FIG. 9A after the bulk-CMOS die is mounted to a module substrate and an inner protective layer is molded to the module substrate.

FIG. 9C is a cross-sectional diagram of the bulk-CMOS die after thinning by removal of the handle layer.

FIG. 9D is a cross-sectional diagram of a completed circuit module after an outer protective layer has been disposed over the thinned bulk-CMOS die.

FIG. 10A is a cross-sectional diagram of a die with a relatively thicker low-resistivity handle layer.

FIG. 10B is a cross-sectional diagram of the die of FIG. 10A mounted to a module substrate and in the process of being thinned using mechanical etching.

FIG. 10C is a cross-sectional diagram of the die of FIG. 10B wherein removal of the thinned low-resistivity handle layer is completed using chemical etching.

FIG. 10D is a cross-sectional diagram of the thinned die of FIG. 10C after a protective layer has been disposed over the die.

FIG. 10E is a cross-sectional diagram of a completed module after a top molding had been added over the protective layer.

FIG. 11A is a cross-sectional diagram of a bulk-CMOS die that includes deep wells within a low-resistivity handle layer.

FIG. 11B is a cross-sectional diagram of the die of FIG. 11A while temporarily mounted to a mechanical support.

FIG. 11C is a cross-sectional diagram after the low-resistivity handle layer has been chemically etched away.

FIG. 11D is a cross-sectional diagram after a protective layer has been molded over the deep wells.

FIG. 11E is a cross-sectional diagram of a completed chip module after the protective layer has first been polished and the mechanical support has been detached from the completed chip module.

FIG. 17 is a cross-sectional diagram of an alternate embodiment that provides a low cost integrated passive die (IPD) 146 wherein a low resistivity substrate has been removed and replaced with a protective layer, such as a ceramic or polymer layer.

DETAILED DESCRIPTION

Figure 1:
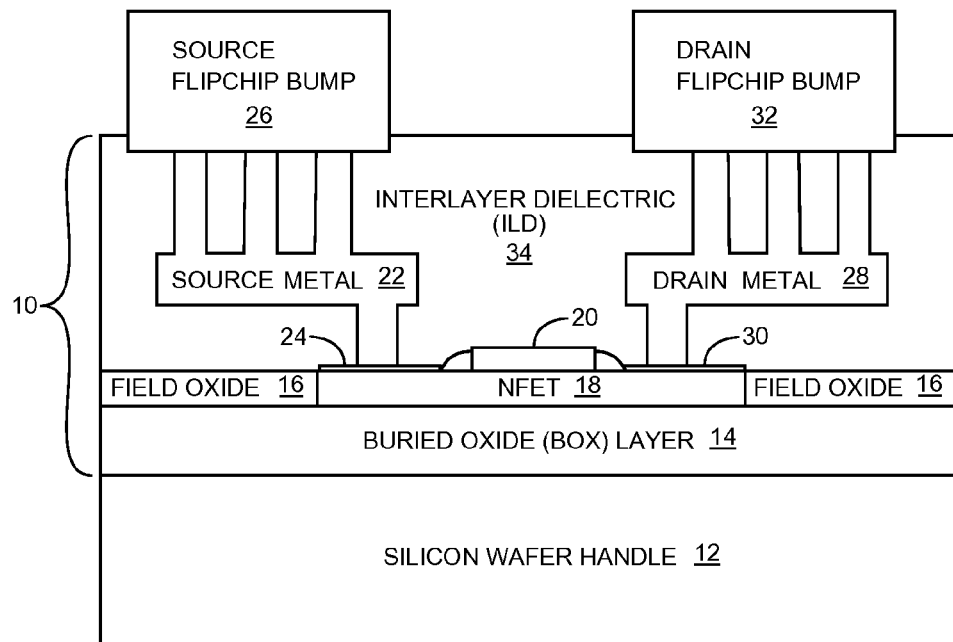
FIG. 1 is a cross-sectional diagram of a related art semiconductor stack structure interfaced with a relatively low-resistivity silicon wafer handle.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

Traditional RFCMOS SOI technologies have reached a fundamental barrier due to limitations inherent to silicon wafer handles that prevent the relatively better insulating characteristics available in group 111-V or sapphire substrates. The disclosed semiconductor device replaces the silicon wafer handle with a polymer substrate. As such, the semiconductor device of this disclosure eliminates the need for a high resistivity silicon wafer handle in a provided semiconductor stack structure.

Advanced silicon substrates for RF switch applications have resistivities that range from 1000 Ohm-cm to 5000 Ohm-cm and are significantly more costly than standard silicon substrates having much lower resistivities. Moreover, relatively complex process controls are needed to realize high resistivity in advanced silicon substrates. For these reasons standard silicon substrates are used ubiquitously in standard SOI technologies. However, standard silicon substrates with their much lower resistivities are not conducive for stacking a plurality of relatively low voltage field effect transistors (FETs) while maintaining a desired isolation between the low voltage FETs. Fortunately, the polymer substrate of the present disclosure replaces the silicon substrate and thus, eliminates the problems associated with both high and low-resistivity silicon substrates.

Additionally, the methods of the present disclosure allow for an immediate migration to 300 mm substrates for use in RF power switch applications. This is an important development since there is currently no commercially viable high volume supply of high resistivity RFSOI substrates in the 300 mm wafer diameter format. Fabricating the present semiconductor devices on 300 mm diameter wafers would provide a significant improvement in die costs. Moreover, the need for a trap rich layer and/or harmonic suppression techniques is eliminated, thereby resulting in a significantly simpler process flow and lower cost.

Further still, the polymer substrate is expected to eliminate RF nonlinear effects resulting from the interface between the BOX layer and the silicon substrate used in traditional semiconductor processes to manufacture RF switch devices. The present methods realize RF switch devices that have linear characteristics relatively close to ideal linear characteristics.

Additionally, the semiconductor device of this disclosure offers a near ideal voltage stacking of NFET transistors. Traditionally, the number of NFET devices that can be stacked is limited by silicon substrate resistivity combined with the interface effects between the BOX layer and the silicon wafer handle. This issue essentially limits the number of practical NFET transistors that can be stacked and thus, limits the highest RF operating voltage for the resulting NFET transistor stack. Replacing silicon wafer handles with the polymer substrate of the present disclosure allows relatively many more NFET transistors to be practically ideally stacked. The resulting semiconductor device is operable at relatively much higher RF power levels and RMS voltages than is traditionally allowable on silicon handle wafer technologies.

Furthermore, the highest RF frequency of operation of RF power switches built with the disclosed polymer substrate can be extended beyond the highest frequency of operation achievable with traditional RFCMOS SOI technologies. Typically, a silicon wafer handle resistivity is in the range of 1000-3000 Ohm-cm, which effectively imposes an operational high frequency limit. The resulting resistivity of the polymer substrate region in the semiconductor device taught in this disclosure is several orders of magnitude higher than what is achieved in high resistivity silicon. For instance, there are polymers with nearly ideal electrically insulating characteristics, with resistivity values similar to what is obtained in gallium arsenide (GaAs) and sapphire semi-insulating substrates.

FIG. 1 is a cross-sectional diagram of a related art semiconductor stack structure 10 interfaced with a relatively low-resistivity silicon wafer handle 12. In the exemplary case of FIG. 1, the semiconductor stack structure 10 includes a buried oxide (BOX) layer 14, a field oxide layer 16, and an NFET device layer 18, with a gate 20. A source metal conductor 22 couples a source contact 24 with a source flipchip bump 26. Similarly, a drain metal conductor 28 couples a drain contact 30 with a drain flipchip bump 32. An interlayer dielectric (ILD) 34 protects the gate 20 and supports the source flipchip bump 26 and the drain flipchip bump 32. While FIG. 1 refers to source and drain metal conductors as well as source and drain flip chip bumps, it is to be understood that these references can be interpreted more generally to refer to first and second metal conductors and first and second flipchip bumps.

Figure 2:
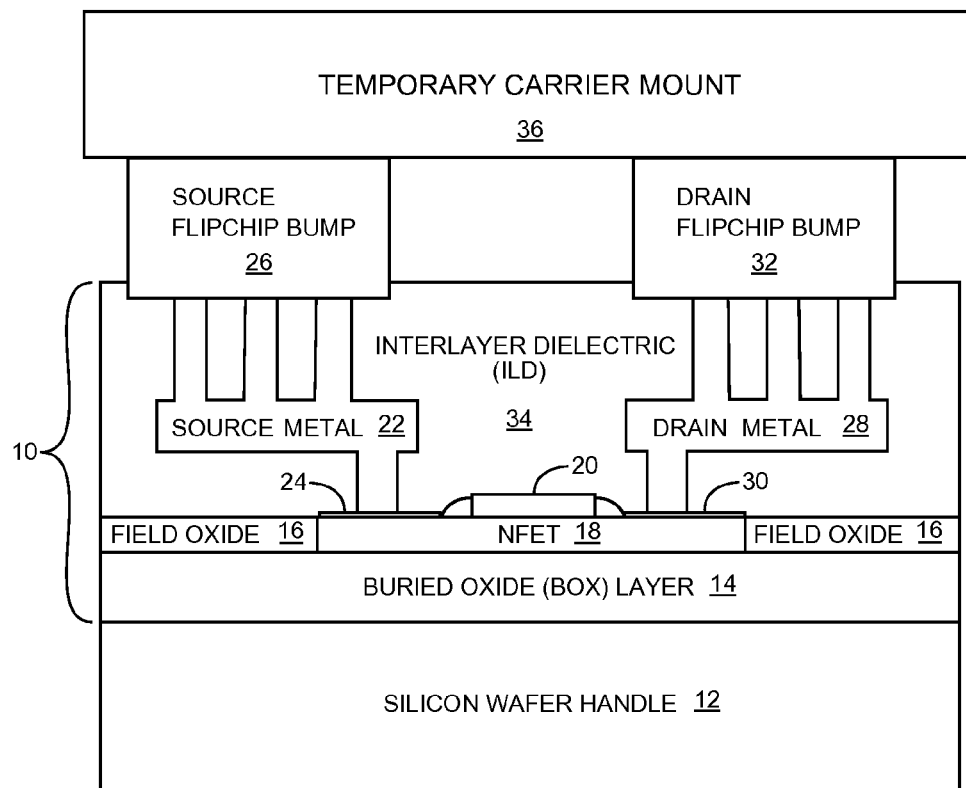
FIG. 2 is a cross-sectional diagram of the related art semiconductor stack structure with a temporary carrier mount for carrying the semiconductor stack structure during subsequent processing steps.

FIG. 2 is a cross-sectional diagram of the related art semiconductor stack structure 10 with a temporary carrier mount 36 for carrying the semiconductor stack structure 10 during subsequent processing steps. In this exemplary case, the temporary carrier mount 36 is attached to the source flipchip bump 26 and the drain flipchip bump 32. A goal of the temporary carrier mount 36 is to provide a good mechanical mount to the semiconductor stack structure 10 for further processing, and also for protecting a finished semiconductor device from being damaged by post process flows. A common technique for mounting to the temporary carrier mount 36 uses thick quartz carrier substrates that have several through-holes that are attached to the finished SOI wafer using a specially designed ultraviolet (UV) adhesive tapes. This effectively bonds the temporary carrier to the source flipchip bump 26 and the drain flipchip bump 32. This mounting technique provides chemical and mechanical protection needed during a process to replace the silicon wafer handle 12 with a polymer substrate. The mounting technique also allows for the easy dismount of a finished semiconductor device by a simple UV light exposure that makes the tape readily solvable in approved solvents. A number of other temporary carrier mount/dismount techniques are usable for the same purpose of providing chemical and mechanical protection needed during the process to replace the silicon wafer handle 12 with a polymer substrate.

Figure 3:
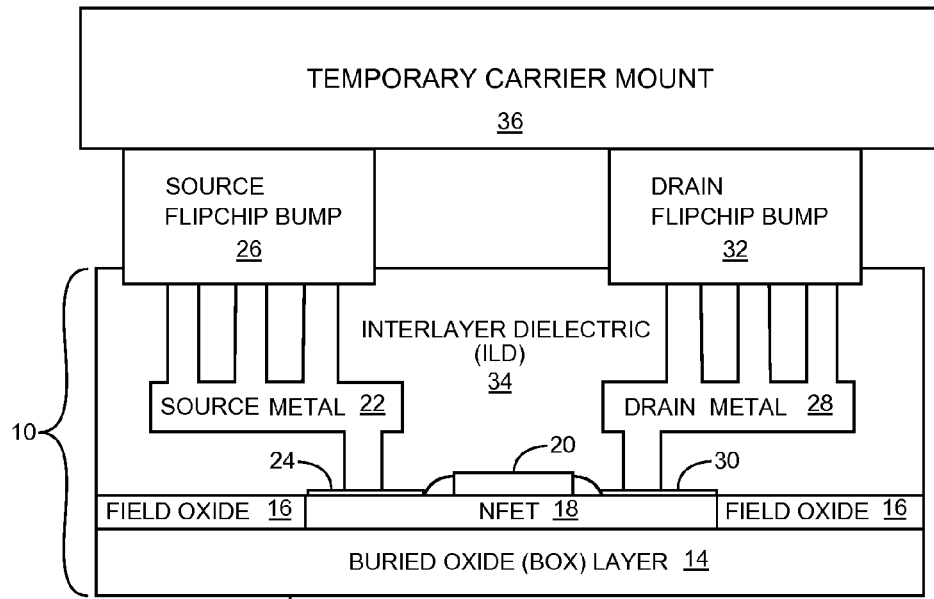
FIG. 3 is a cross-sectional diagram of the related art semiconductor stack structure after the relatively low-resistivity silicon wafer handle has been removed.

FIG. 3 is a cross-sectional diagram of the related art semiconductor stack structure 10 after the relatively low-resistivity silicon wafer handle 12 has been removed. Once the semiconductor stack structure 10 is protected by the temporary carrier mount 36, the silicon wafer handle 12 may be removed by a number of different techniques. One technique uses a conventional grind operation that removes a majority of the silicon wafer handle 12 followed by a selective wet or dry etch step of the remaining silicon wafer handle 12, and selectively stopping at a first surface 38 of the semiconductor stack structure 10. In this exemplary case, the first surface 38 is also the exposed surface of the BOX layer 14. Other techniques for removal of the silicon wafer handle 12 exist and are well documented in the literature. Some of these other techniques are based on dry or wet etch processes. The process used to remove the silicon wafer handle 12 is not particularly relevant to the present disclosure. However, it is desirable for the removal of the silicon wafer handle 12 to be accomplished without damaging the BOX layer 14 and the remainder of the semiconductor stack structure 10 as well as the source flipchip bump 26 and the drain flipchip bump 32.

Figure 4:
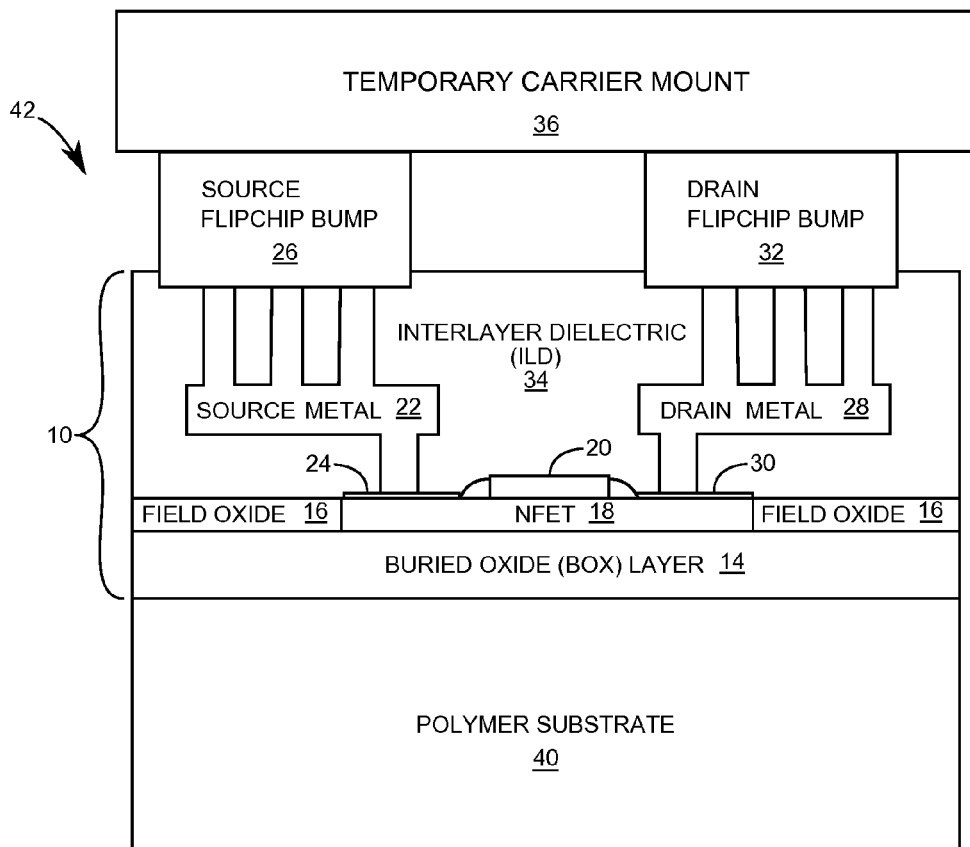
FIG. 4 is a cross-sectional diagram of the related art semiconductor stack structure after a polymer substrate has been disposed onto the buried oxide (BOX) layer to realize the semiconductor device of the present disclosure.

FIG. 4 is a cross-sectional diagram of the related art semiconductor stack structure 10 after a polymer substrate 40 has been disposed onto the BOX layer 14 to realize a semiconductor device 42. The polymer material making up the polymer substrate 40 has a unique set of characteristics in that the polymer material is both a relatively excellent electrical insulator and a relatively excellent heat conductor. Typical polymer materials making up common plastic parts are extremely poor conductors of heat. Poor heat conduction is a common characteristic of plastics normally used in an over-mold operation. However, there are proprietary polymer materials that do provide relatively excellent heat conduction. Various formulations for such polymers yield thermal conductivities that range from around about 2 Watts per meter Kelvin (W/mK) to around about 50 W/mK. In one embodiment, the thermal conductivity of the polymer substrate ranges from around about 50 W/mK to around about 6600 W/mK. In another embodiment, a thermal resistivity of the polymer substrate is about zero. Future enhancements in polymer science may provide additional improvements in terms of thermal conductivity while maintaining nearly ideal electrical insulating characteristics in the polymer. The structure of this disclosure benefits from the optimization of the polymer thermal conductivity and it should be understood that there are no upper bound values in terms of polymer thermal conductivity.

It is desirable that a polymer material usable for the polymer substrate 40 be relatively strongly bondable to the first surface 38 of the semiconductor stack structure 10. For example, the polymer material needs a bonding strength that allows the semiconductor device 42 to be dismounted from the temporary carrier mount 36 and remain permanently bonded after additional processing steps as well as throughout the operational lifetime of the semiconductor device 42. Moreover, a desirable thickness for the polymer substrate 40 ranges from around about 100 µm to around about 500 µm, but other desirable thicknesses for the polymer substrate 40 can be thinner or thicker depending on the characteristics of the polymer material used to make up the polymer substrate 40.

The polymer material making up the polymer substrate 40 should also be a good electrical insulator. In general, the electrical resistivity of the polymer substrate 40 should be at least $10^3$ Ohm-cm and it is preferable for the polymer to have a relatively high electrical resistivity that ranges from around about $10^{12}$ Ohm-cm to around about $10^{16}$ Ohm-cm. In combination with relatively high electrical resistivity, it is preferred that the thermal conductivity of the polymer substrate 40 be on the order of the thermal conductivity of typical semiconductors, which is typically greater than 2 W/mK. In one embodiment, the thermal conductivity of the polymer substrate 40 ranges from greater than 2 W/mK to around about 10 W/mK. In yet another embodiment, the thermal conductivity of the polymer substrate 40 ranges from around about 10 W/mK to around about 50 W/mK. As polymer science provides materials with additional thermal conductivities, these materials can be utilized in the semiconductor device of this disclosure, as there are no upper bounds for how high the polymer thermal conductivity may be with regards to this disclosure.

Figure 5:
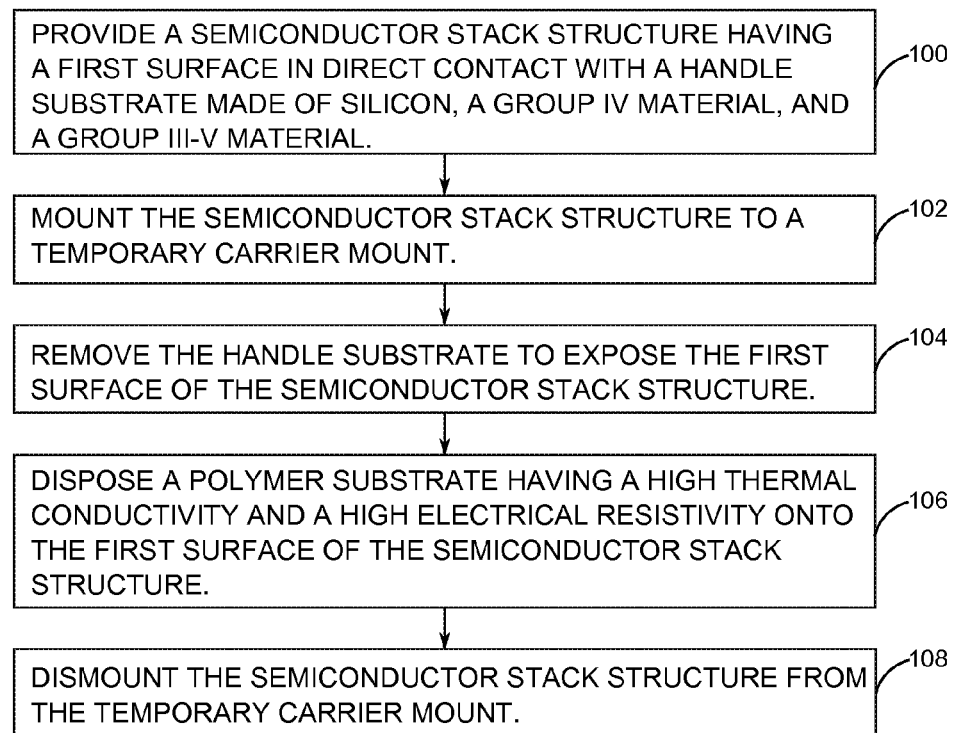
FIG. 5 is a process diagram for a process that yields the related art semiconductor device having the polymer substrate disposed on the BOX layer of the semiconductor stack structure.

FIG. 5 is a related art process diagram that yields the semiconductor device 42 having the polymer substrate 40 disposed on the first surface 38 of the semiconductor stack structure 10. The exemplary process begins with providing the semiconductor stack structure 10 having the first surface 38 of the BOX layer 14 in direct contact with the silicon wafer handle 12 (step 100). While the semiconductor stack structure 10 is attached to the silicon wafer handle 12 at the beginning of the process, it is to be understood that a wafer handle made of other group IV or III-V semiconductors is also usable in place of the silicon wafer handle 12.

The semiconductor stack structure 10 is then mounted to the temporary carrier mount 36 with the source flipchip bump 26 and the drain flipchip bump 32 facing the temporary carrier mount 36 (step 102). The process then continues by removing the silicon wafer handle 12 to expose the first surface 38 of the semiconductor stack structure 10 (step 104). The polymer substrate 40 can then be attached to the first surface 38 of the semiconductor stack structure 10 using various polymer material disposing methods (step 106). Such methods for attaching the polymer substrate 40 to the first surface 38 of the semiconductor stack structure 10 include, but are not limited to, injection molding, spin deposition, spray deposition, and pattern dispensing of polymer material directly onto the first surface 38 of the semiconductor stack structure 10. Once the polymer substrate 40 is attached to the first surface 38 of the semiconductor stack structure 10, the temporary carrier mount 36 is dismounted (step 108).

The sequence of steps used in processes to manufacture the semiconductor device 42 will depend on the type of carrier and mounting processes used. There are a number of such processes available. A typical dismount step used extensively for through-substrate-via (TSV) processing includes exposing the UV adhesive tape that mounted the wafer to a transparent quartz carrier to UV light, which alters the chemistry of the UV tape so that the semiconductor device 42 can be easily separated from the temporary carrier mount 36. The semiconductor device 42 can then be cleaned with common chemical solvents and/or plasma cleaning processes.

The semiconductor device 42 can then be singulated from an original wafer (not shown) into individual die by a number of different conventional processes. Typically a saw operation that cuts through the semiconductor stack structure 10 and polymer substrate 40 is the preferred method of die singulation. Other singulation methods such as laser sawing, laser scribing or diamond scribing can be used as alternatives.

It should be noted that the semiconductor device and methods taught in this disclosure begin with a conventionally manufactured RFSOI CMOS wafer which in this exemplary case is the semiconductor stack structure 10 disposed on the silicon wafer handle 12. However, one distinction is that there is no need for the silicon wafer handle 12 to have high resistivity, since the silicon wafer handle 12 is removed and does not become part of the semiconductor device 42. If the semiconductor device 42 requires flipchip packaging, it should ideally already include the source flipchip bump 26 and the drain flipchip bump 32, although such a requirement may not be necessary depending on the specific characteristics of the bump or pillar packaging technology employed. In this exemplary case, it is assumed that a wafer process was completed through bumping.

Figure 6:
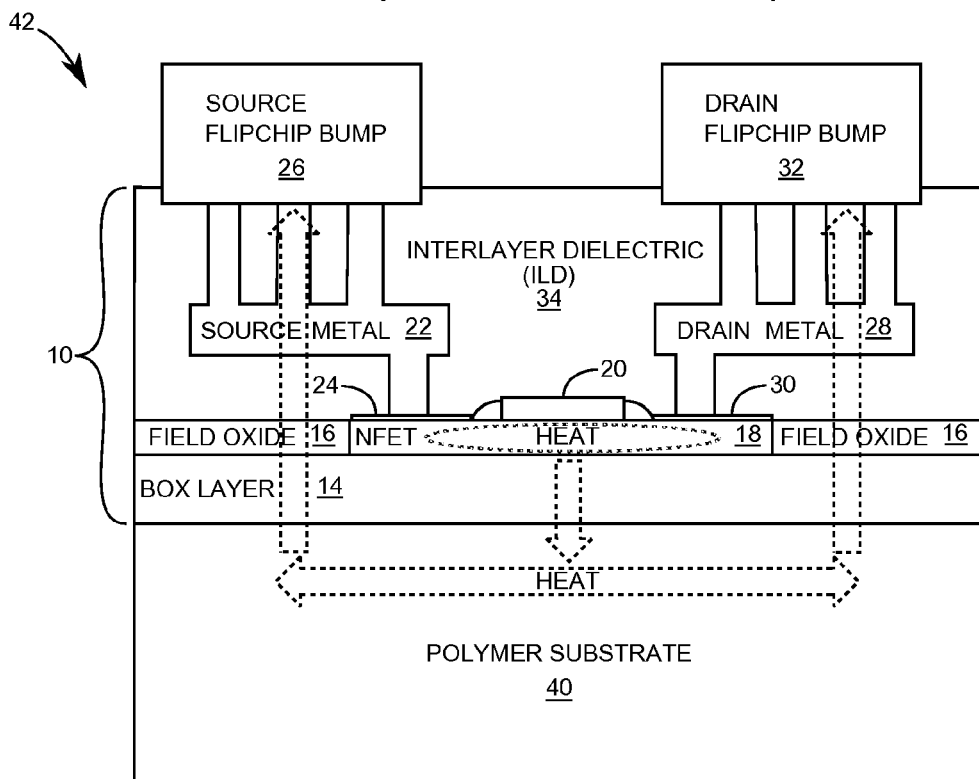
FIG. 6 is a cross-sectional diagram of the related art semiconductor device showing heat flow paths through the semiconductor device with the polymer substrate after the semiconductor device has reached a steady state powered condition.

FIG. 6 is a related art cross-sectional diagram of the semiconductor device showing heat flow paths through the semiconductor device 42 with the polymer substrate 40 after the semiconductor device 42 has reached a steady state powered condition. Under normal operation, heat is generated by energy losses in the NFET 18. An origin for the heat generated is represented by a dashed oval in the BOX layer 14 adjacent to the NFET 18. The flow of heat is represented by dashed arrows. As usual for high performance RF applications, the semiconductor device 42 is flipchip mounted in its final application. As such, the heat to be extracted is transferred by thermal conduction to the source flipchip bump 26 and the drain flipchip bump 32. Thermal analysis of typical SOI technologies indicates that unless the silicon wafer handle 12 (FIG. 1) is replaced with a good thermal conductive material, the NFET 18 quickly overheats under nominal conditions and essentially becomes very unreliable and likely fails. Under normal conditions and design rules, back-end-of-line metallization layers (not shown) provide too high a thermal resistance path to be used effectively as a means to dissipate the heat generated by the device. The polymer substrate 40 accomplishes effectively the same function as the original silicon wafer handle 12 from a thermal management point of view while also providing much improved linear characteristics and effectively much higher substrate resistivity than the 1 kOhm-cm substrate resistivity of the silicon wafer handle 12.

FIG. 7 is a specification table that lists thermal, mechanical, electrical, and physical specifications for an exemplary polymer material that is usable to form the polymer substrate 40 of the semiconductor device 42. It is to be understood that the specification table only provides exemplary specifications and that a variety of mechanical and physical properties are available within the scope of the present disclosure. Moreover, the quantitative values for the thermal and electrical properties provided in the table of FIG. 7 only represent exemplary values that are within the range of thermal and electrical properties already discussed in the above disclosure.

FIG. 8A is a cross-sectional diagram of a related art bulk complementary metal oxide semiconductor (bulk-CMOS) die 44 having a first deep-N-well 46 and a second deep-N-well 48 within a P-substrate 50. The first deep-N-Well 46 surrounds a field effect transistor (FET) structure 52 having a source terminal (S) coupled to an N+ source, a gate terminal (G) coupled to a gate contact 54 over a P-well 56, and a drain terminal coupled to an N+ drain. The P-well 56 further includes a P+ region. FIG. 8B is a cross-sectional diagram of a related art bulk-CMOS die 58 having a merged N-well 60 integrated with a global deep N-well 62.

FIG. 9A is a cross-sectional diagram of a bulk-CMOS die 64 having a device layer made up of a global deep N-well 66 and an active layer 68 supported by a low-resistivity handle layer 70 in accordance with the present disclosure. The low-resistivity handle layer 70 typically comes from a standard silicon wafer (not shown).

FIG. 9B is a cross-sectional diagram of the bulk-CMOS die 64 after the bulk-CMOS die 64 is mounted to a module substrate 72. An inner protective layer 74 is molded to the module substrate 72 to protect the active region 68 during a process of removing the low-resistivity handle layer 70. The inner protective layer 68 extends between the module substrate 72 and the active layer 74 of the bulk-CMOS die 64, and surrounds electrical contacts 76. The electrical contacts 76 can be solder bumps or copper (Cu) pillars.

FIG. 9C is a cross-sectional diagram of the bulk-CMOS die 64 of FIG. 9B after thinning by removal of the low-resistivity handle layer 70. A thinned bulk-CMOS die 64T results from the thinning process that typically is performed with chemical etching. A relatively common chemical etching technique used to remove silicon substrates is described in a 1993 Institute of Electrical and Electronics Engineers (IEEE) paper entitled "Photo-Assisted Electrochemical Machining of Micromechanical Structures" by R. Micak and H. L. Tuller, which is hereby incorporated by reference in its entirety. In general, the paper discloses the use of selective chemical etching of n-type silicon regions and p-type of a p-n structure at controlled rates. Factors controlling the selectivity of etch and the rate of etch include appropriate choice of bias voltage, p-n junction bias and illumination intensity.

In this regard, Micak discloses that p-type silicon is etched by anodically biasing the p-type silicon relative to a p-n junction that is maintained under illumination. Micak reports that this technique removes p-type silicon at rates up to 5 µm/min using silicon etching solutions. In contrast, Micak discloses that n-type silicon is etched by reverse biasing the p-n junction under illumination while driving the p-type silicon cathodic. In this case, Micak reports that etch rates of up to 10 µm/min, with high resolution stops, result in smooth surfaces. Exemplary silicon etching solutions usable with these techniques include but are not limited to nitric acid ($HNO_3$), hydrofluoric acid (HF), acetic acid ($H_3COOH$), potassium hydroxide (KOH), and sodium hydroxide (NaOH).

FIG. 9D is a cross-sectional diagram of a completed circuit module 80 after an outer protective layer 78 has been disposed over the thinned bulk-CMOS die 64T. In this exemplary embodiment, the deposition of the outer protective layer 78 is achieved using molding.

FIG. 10A is a cross-sectional diagram of a bulk-CMOS die 82 having a device layer made up of a global deep N-well 84 and an active layer 86 supported by a relatively thicker low-resistivity handle layer 88. FIG. 10B is a cross-sectional diagram of the bulk-CMOS die 82 of FIG. 10A after the bulk-CMOS die 82 is mounted to a module substrate 90. An inner protective layer 92 is molded to the module substrate 90 to protect the active layer 86 during mechanical and/or chemical processes of removing the relatively thicker low-resistivity handle layer 88. The inner protective layer 92 extends between the module substrate 90 and the active layer 86 of the bulk-CMOS die 88, and surrounds electrical contacts 94. The electrical contacts 94 can be solder bumps or copper (Cu) pillars. The mechanical etching process realizes a thinned low-resistivity handle layer 88T.

FIG. 10C is a cross-sectional diagram of the bulk-CMOS die 82 of FIG. 10B wherein a thinned bulk-CMOS die 82T results from the removal of the thinned low-resistivity handle layer 88T is completed using chemical etching. FIG. 10D is a cross-sectional diagram of thinned die 82T of FIG. 10C after a mid-protective layer 96 has been disposed over the thinned die 82T. The mid-protective layer 96 in at least one embodiment is a polymer having characteristics of those disclosed in the specification table of FIG. 7. In at least one other embodiment, the mid-protective layer 96 is made of ceramic material. In any embodiment, the thermal conductivity of the mid-protective layer 96 is on the order of the thermal conductivity of typical semiconductors, which is typically greater than 2 W/mK. In another embodiment, the thermal conductivity of the polymer substrate 40 ranges from greater than 2 W/mK to around about 10 W/mK. In yet another embodiment, the thermal conductivity of the mid-protective layer 96 ranges from around about 10 W/mK to around about 50 W/mK. As polymer science provides materials with additional thermal conductivities, these materials can be utilized in the semiconductor device of this disclosure, as there are no upper bounds for how high the polymer thermal conductivity may be with regards to this disclosure.

FIG. 10E is a cross-sectional diagram of a completed module 98 after a top molding that comprises an outer protective layer 100 added over the mid-protective layer 96. The outer protective layer 100 is typically made of a thermoset plastic such as epoxy, ceramic such as silicon nitride or a polymer such as those specified in the specifications table of FIG. 7.

FIG. 11A is a cross-sectional diagram of a bulk-CMOS die 102 that includes deep wells 104 within a low-resistivity handle layer 106. FIG. 11B is a cross-sectional diagram of the bulk-CMOS die 102 of FIG. 11A while temporarily mounted to a mechanical support 108. The bulk-CMOS die 102 is carried and protected by the mechanical support 108 during processing.

FIG. 11C is a cross-sectional diagram of the bulk-CMOS die 102 after the low-resistivity handle layer 106 has been chemically etched away. FIG. 11D is a cross-sectional diagram of the bulk-CMOS die 102 after a protective layer 110 has been molded over the deep wells 104. FIG. 11E is a cross-sectional diagram of a completed chip module 112 after the protective layer 110 has first been polished and the mechanical support 108 has been detached from the completed chip module 112.

Figure 12:
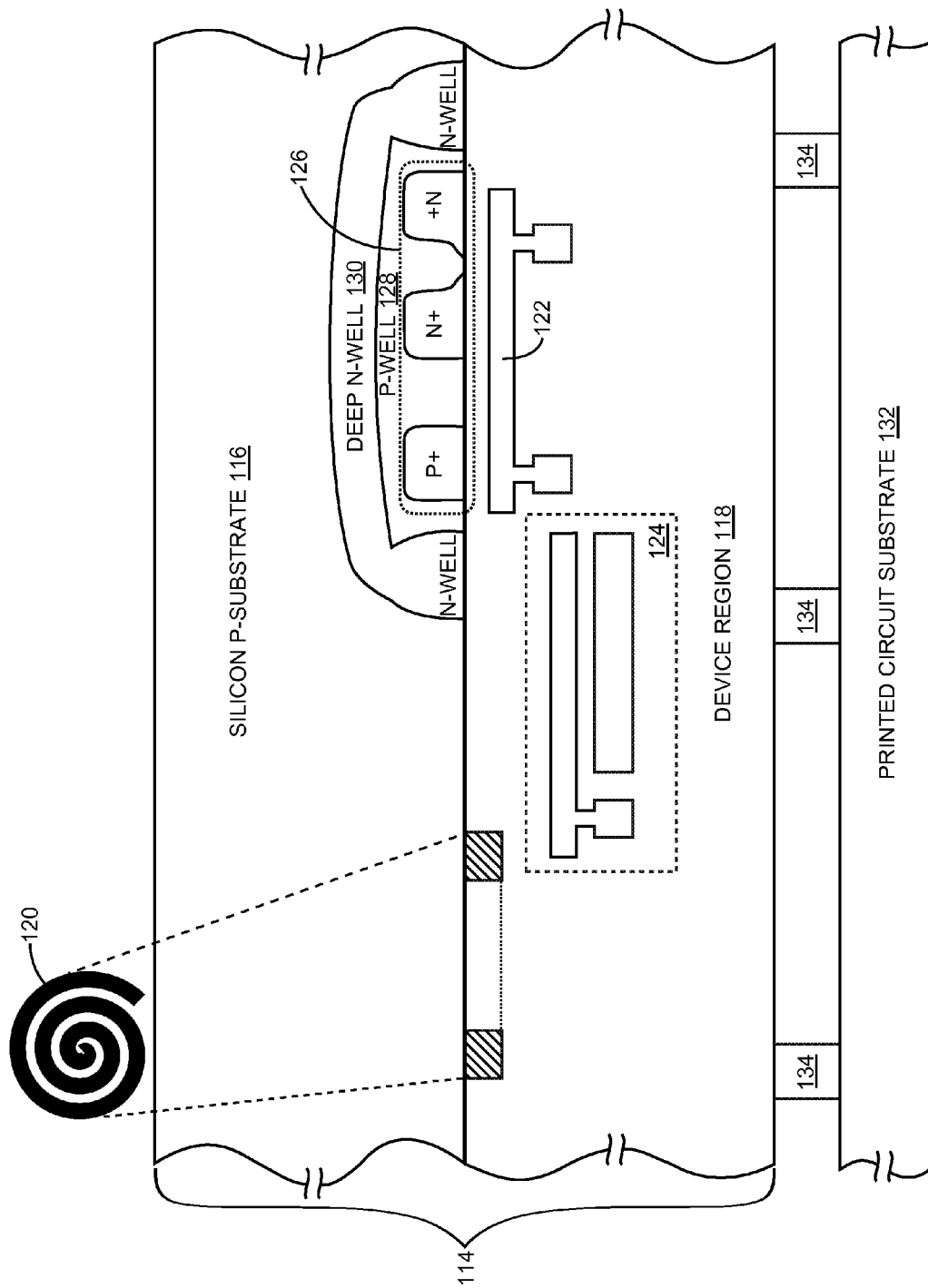
FIG. 12 is a cross-sectional diagram of a bulk-CMOS die having passive and active components that are supported by a silicon P-substrate before the silicon P-substrate is removed.

FIG. 12 is a cross-sectional diagram of a bulk-CMOS die 114 having passive and active components within a device region 118 that are supported by a silicon P-substrate 116 before the silicon P-substrate 116 is removed. In this exemplary embodiment, the passive components within the device region include a spiral inductor 120, a resistor 122, and a capacitor 124. An active component 126, for example, is shown isolated within a P-well 128 that is enclosed by a deep N-well 130. The active component 126 is depicted as a portion of a field effect transistor, but it is to be understood that other active components such as diodes are also within the scope of the present disclosure.

A printed circuit substrate 132 supports the bulk-CMOS die 114 during and after processing. Electrical connectors 134 such as solder bumps or copper pillars couple the bulk-CMOS die 114 to the printed circuit substrate 132 both electrically and mechanically.

Figure 13:
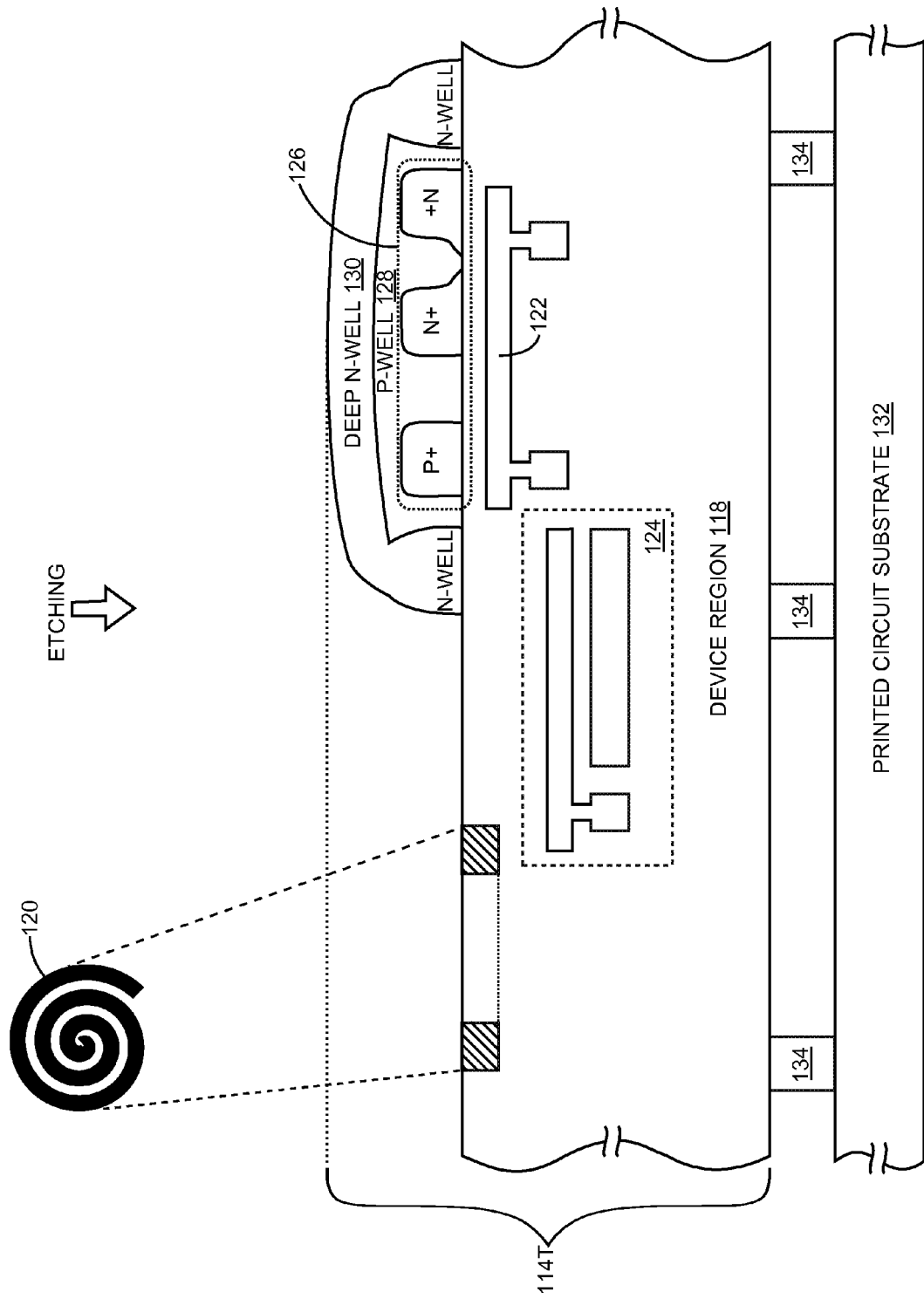
FIG. 13 is a cross-sectional diagram of the bulk-CMOS die of FIG. 12 after the silicon substrate has been removed to realize a thinned bulk-CMOS die.
Figure 14:
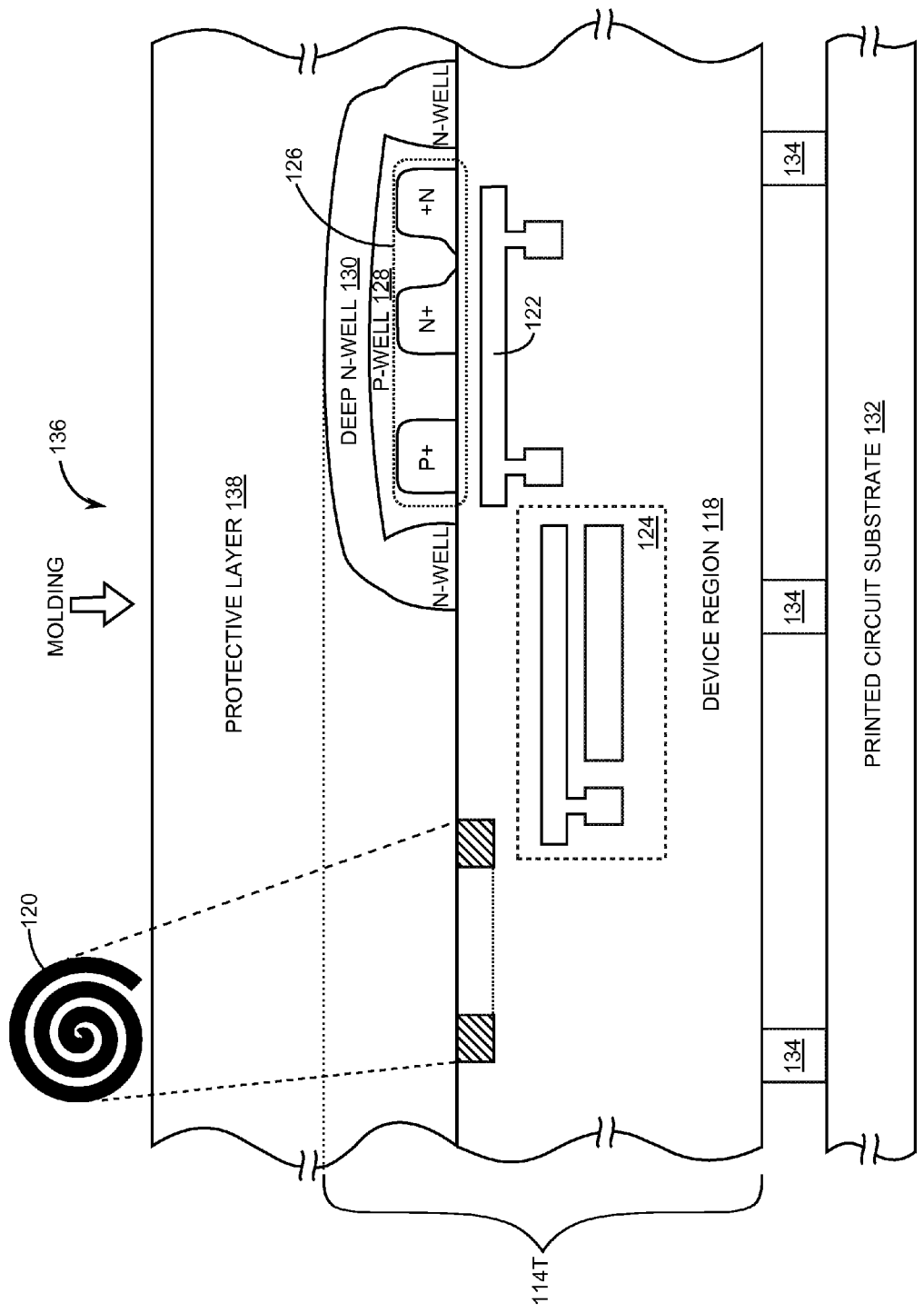
FIG. 14 is a cross-sectional diagram of a completed bulk-CMOS module having a protective layer disposed over the thinned die to provide permanent protection of the thinned bulk-CMOS die.

FIG. 13 is a cross-sectional diagram of the bulk-CMOS die 114 of after the silicon P-substrate 116 has been removed to realize a thinned bulk-CMOS die 114T. FIG. 14 is a cross-sectional diagram of a completed bulk-CMOS module 136 having a protective layer 138 disposed over the thinned die 114T (FIG. 12) to provide permanent protection of the thinned bulk-CMOS die 114T. In this exemplary embodiment, the protective layer 138 is molded directly over the deep N-well 130. However, it is to be understood that an adhesion enhancing layer such as a nitride layer can be disposed to reside between the deep N-well 130 and the protective layer 138.

Figure 15:
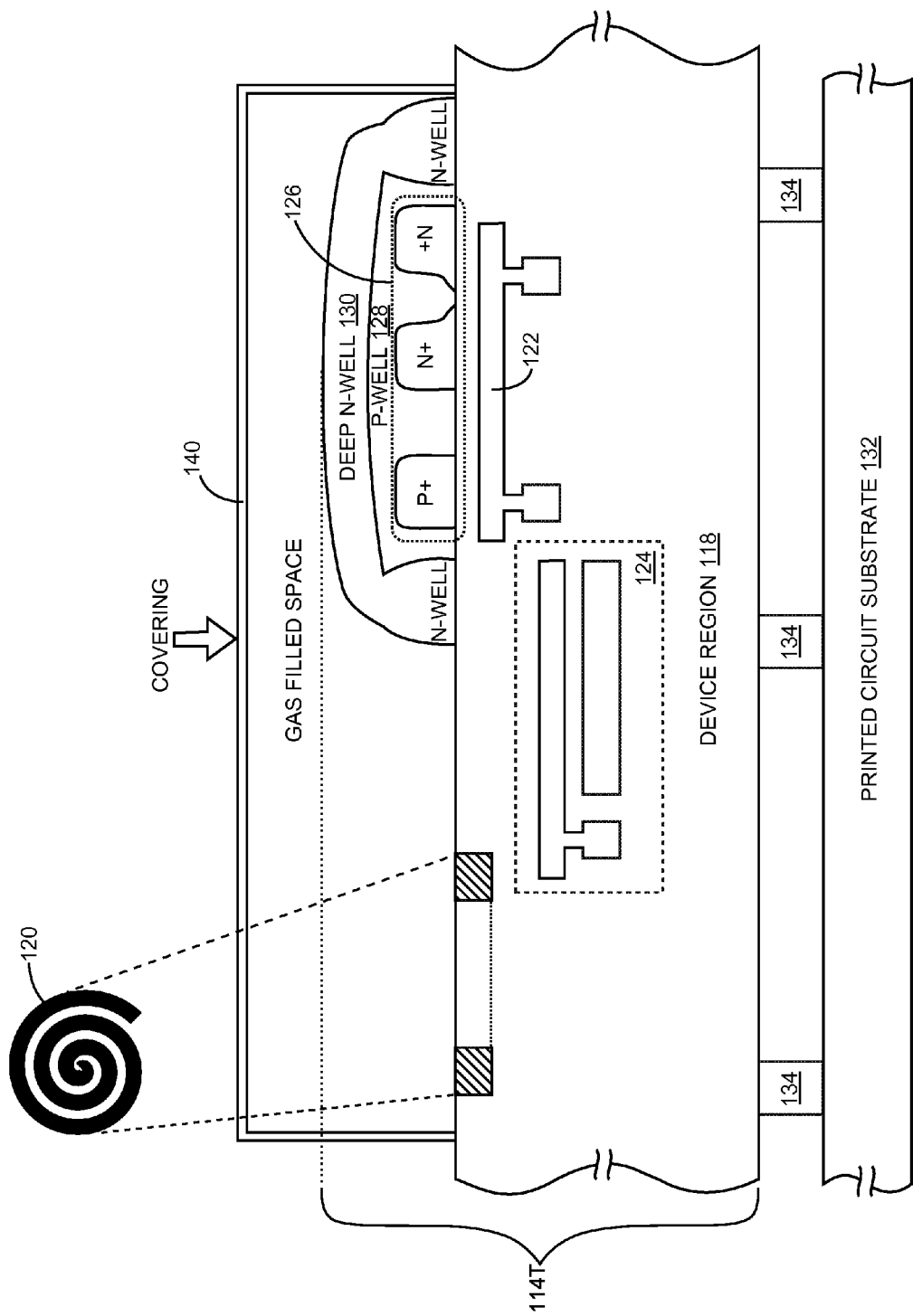
FIG. 15 is a cross-sectional diagram of an alternative embodiment processed from the state of FIG. 12 to add a micro-shield over at least a portion of the thinned die.

FIG. 15 is a cross-sectional diagram of an alternative embodiment processed from the state of FIG. 13 to add a micro-shield 140 over at least a portion of the thinned die 114T (FIG. 13). The micro-shield 140 encloses a gas filled space over at least a portion of the thinned die 114T. Air is typically used as the gas making up the gas filled space although other gases such as relatively pure nitrogen are also usable. The gas filled space provides a minimal parasitic capacitance between the components such as the spiral inductor 120, the resistor 122, the capacitor 124, and the active component 126. As such, losses associated with parasitic capacitances are also minimized.

Figure 16:
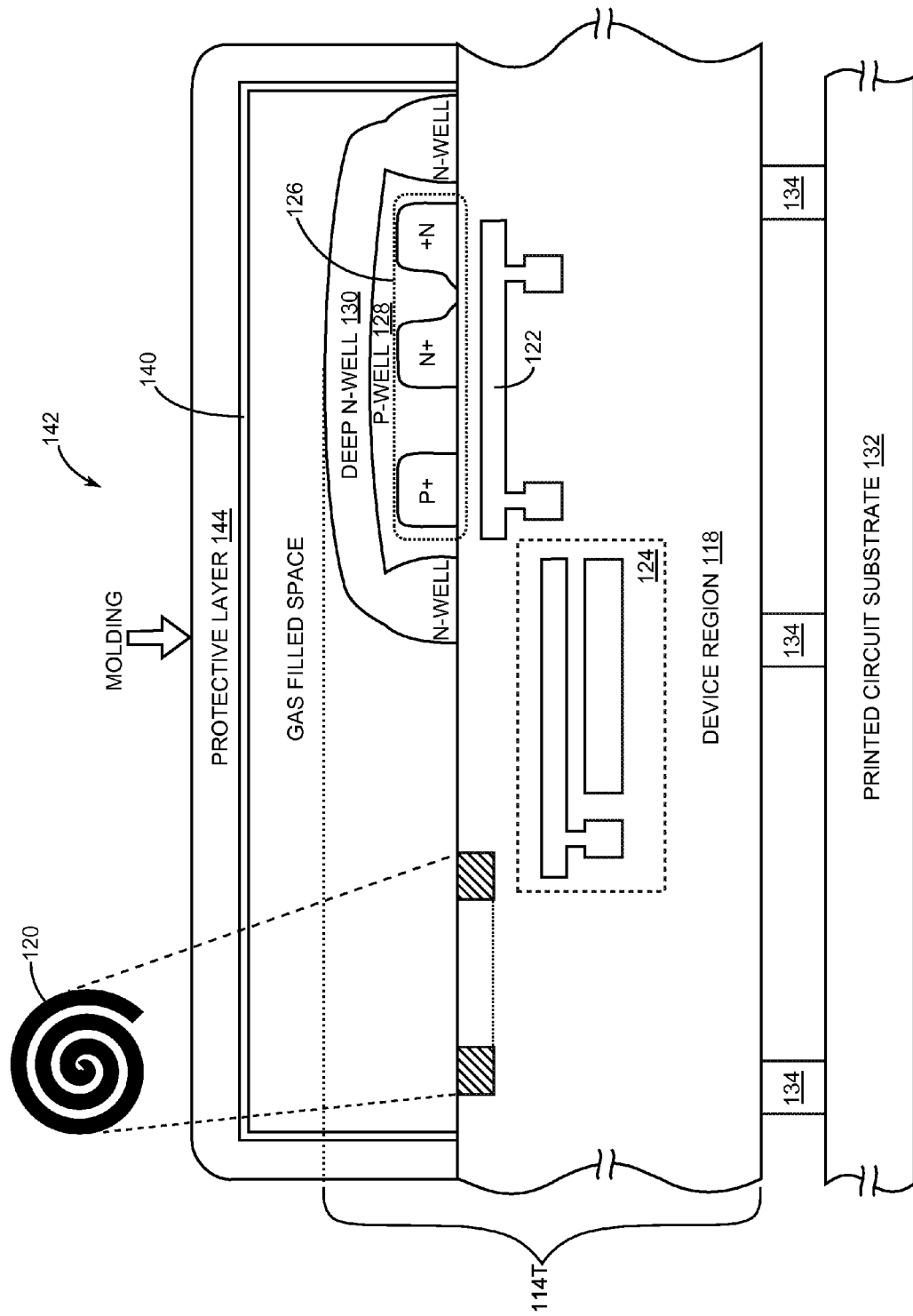
FIG. 16 is a cross-sectional diagram of the alternative embodiment that realizes a completed bulk-CMOS module that has been further processed from the state of FIG. 15 to include a protective layer that covers the micro-shield.

FIG. 16 is a cross-sectional diagram of an alternative embodiment that realizes a completed bulk-CMOS module 142 that has been further processed from the state of FIG. 15 to include a protective layer 144 that encapsulates the micro-shield 140. The protective layer 144 is typically made of a thermoset plastic such as epoxy, ceramic such as silicon nitride or a polymer such as listed in the specification table of FIG. 7.

The actual formulation of a material for protective layer 144 is not itself important, except that the material provides electrical resistivity that exceeds 1 Mega Ohm-cm) while providing a thermal conductivity of at least >2 W/mK). Materials for protective layer 144 with thermal conductivity values in the range of 10-50 W/mK are presently available in industry.

Once the protective layer 144 is disposed over the micro-shield 140 by molding or other deposition process, the protective layer 144 provides rigidity necessary for various operational environments. An appropriate thickness for the protective layer 144 ranges from about 100 μm to around 500 μm. However, the protective layer 144 can be 75% thinner or 200% thicker depending on the mechanical characteristics of the material used to make up the protective layer 144.

The protective layer 144 can be formed using various methods. Such methods include simple injection and compression molding techniques, spin-on deposition, sprayed-on type of processes, and dispensing of the material in a predetermined pattern such as a rectangle or other polygonal shapes. In a specific case of forming the protective layer 144 from a ceramic material, a sputtering technique is usable for disposing the ceramic over the thinned die 114T.

A standard integrated passive die (IPD) integrates together high quality passive devices with metal and other materials in a back end of line (BEOL) process. Typically, the BEOL process uses a relatively thick layer of high resistivity silicon as a substrate. The silicon substrate needs high resistivity to achieve a high-Q for integrated passive devices. High resistivity silicon substrates are substantially more expensive than low resistivity substrates.

The present disclosure has provided several embodiments in which substantial cost savings is realized by using low resistivity silicon as a substrate for BEOL processing. As provided in detail throughout this disclosure, the low resistivity silicon substrate is removed by chemical etching and/or mechanical etching. A replacement layer made of a material that provides electrical resistivity that exceeds 1 Mega Ohm-cm while providing a thermal conductivity of at least >2 W/mK is disposed onto the IPD in accordance with the present disclosure. Materials for the replacement layer with thermal conductivity values in the range of 10-50 W/mK are presently available in industry.

FIG. 17 is a cross-sectional diagram of an IPD based embodiment that provides a low cost printed circuit module 146 having a thinned IPD 148 wherein a low resistivity substrate has been removed and replaced with an outer protective layer 150, such as a ceramic or polymer layer. In this exemplary embodiment, the thinned IPD 148 includes a spiral inductor 152, a passive resistor 154, and a metal-insulator-metal (MIM) capacitor 156. The thinned IPD 148 is attached to a printed circuit substrate 158 using electrical connectors 160 such as solder bumps or copper pillars. An etch stop layer 162 such as a layer of oxide typically remains after halting the chemical etch process that removes the low cost and low resistivity substrate. The low cost printed circuit module 146 provides negligible distortion, relatively high thermal conductivity and relatively high mechanical strength.

Those skilled in the art will recognize improvements and modifications to the embodiments of the present disclosure. All such improvements and modifications are considered within the scope of the concepts disclosed herein and the claims that follow.

What is claimed is:

1. A printed circuit module comprising:
   a printed circuit substrate;
   a thinned die attached to the printed circuit substrate and having at least one device layer over the printed circuit substrate and at least one deep well within the at least one device layer; and
   an outer protective layer over the at least one deep well, wherein the outer protective layer has a thermal conductivity greater than 2 watts per meter Kelvin (W/mK) and an electrical resistivity of greater than $10^6$ Ohm-cm.

2. The circuit board of claim 1 further including an inner protective layer that resides between the printed circuit substrate and the thinned die.

3. The printed circuit module of claim 2 wherein the inner protective layer and the outer protective layer are made of a polymer compound.

4. The printed circuit module of claim 3 wherein the outer protective layer is made of ceramic.

5. The printed circuit module of claim 4 wherein the ceramic is aluminum nitride.

6. The printed circuit module of claim 4 wherein the ceramic is silicon nitride.

7. The printed circuit module of claim 2 wherein the inner protective layer is made of ceramic.

8. The printed circuit module of claim 1 wherein the at least one deep well is a deep N-well.

9. The printed circuit module of claim 1 wherein the outer protective layer is made of a polymer compound.

10. The printed circuit module of claim 1 wherein a thickness of the outer protective layer ranges from about 100 µm to around 500 µm.

11. The printed circuit module of claim 1 wherein the thermal conductivity of the protective layer ranges from about 10 W/mK to around 50 W/mK.

12. The printed circuit module of claim 1 wherein the thermal conductivity of the outer protective layer ranges from around about 50 W/mK to around about 6600 W/mK.

13. The printed circuit module of claim 1 wherein the outer protective layer covers a gas filled space over at least a portion of the thinned die.

14. The printed circuit module of claim 13 wherein the at least a portion of the thinned die includes the at least one deep well.

15. The printed circuit module of claim 1 wherein the electrical resistivity of the outer protective layer ranges from about 1012 Ohm-cm to around 1016 Ohm-cm.

16. The printed circuit module of claim 1 wherein the electrical resistivity of the outer protective layer ranges from around about 106 Ohm-cm to around about 1012 Ohm-cm.

17. The printed circuit module of claim 1 further including a mid-protective layer that is disposed between the thinned die and the outer protective layer.

18. The printed circuit module of claim 17 wherein the mid-protective layer is made of ceramic material and the outer protective layer is made of a polymer.

19. The printed circuit module of claim 1 wherein the thinned die is a bulk-complementary metal oxide semiconductor (CMOS) type die.

* * * * *